(12) United States Patent
Akiyama et al.

(10) Patent No.: US 12,277,347 B2
(45) Date of Patent: Apr. 15, 2025

(54) APPARATUS AND METHODS FOR BACK-TO-BACK STATE MACHINE CONTROLLER BUS OPERATIONS

(71) Applicant: Western Digital Technologies, Inc., San Jose, CA (US)

(72) Inventors: Kei Akiyama, Yokohama (JP); Iris Lu, Fremont, CA (US); Yoshito Katano, Fujisawa (JP); Tai-Yuan Tseng, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 63 days.

(21) Appl. No.: 18/466,085

(22) Filed: Sep. 13, 2023

(65) Prior Publication Data

US 2025/0085895 A1    Mar. 13, 2025

(51) Int. Cl.
*G06F 3/06* (2006.01)
*G11C 7/08* (2006.01)

(52) U.S. Cl.
CPC .......... *G06F 3/0659* (2013.01); *G06F 3/0604* (2013.01); *G06F 3/0634* (2013.01); *G06F 3/0679* (2013.01); *G11C 7/08* (2013.01)

(58) Field of Classification Search
CPC .... G06F 3/0659; G06F 3/0604; G06F 3/0634; G06F 3/0679; G11C 7/08
See application file for complete search history.

(56) References Cited

U.S. PATENT DOCUMENTS

| | | | |
|---|---|---|---|
| 2010/0122010 A1* | 5/2010 | Yan | G06F 13/4022 710/316 |
| 2014/0063524 A1* | 3/2014 | Mochizuki | G03G 15/5004 358/1.13 |
| 2020/0004610 A1* | 1/2020 | Hamidouche | H04L 69/321 |

\* cited by examiner

*Primary Examiner* — Tracy C Chan
(74) *Attorney, Agent, or Firm* — PEARL COHEN ZEDEK LATZER BARATZ LLP

(57) ABSTRACT

An apparatus is provided that includes a memory structure including non-volatile memory cells, a first processor and a second processor. The first processor is configured to provide a plurality of sets of commands to a second processor to perform memory operations on the non-volatile memory cells. The second processor is configured to execute the sets of commands and provide a control signal to the first processor. The first processor is further configured to provide the sets of commands to the second processor based on a status of the control signal. The second processor is further configured to control the status of the control signal so that the second processor executes sets of commands with no idle time between consecutive sets of commands.

20 Claims, 13 Drawing Sheets

FIG. 6C

APPARATUS AND METHODS FOR BACK-TO-BACK STATE MACHINE CONTROLLER BUS OPERATIONS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may include non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 6C is a diagram depicting an example operation of the system of FIGS. 6A-6B.

DETAILED DESCRIPTION

Memory systems often include control circuitry coupled to one or more memory die. Control circuitry often includes a microcontroller that receives memory operation commands (e.g., read, program) from a host device, breaks down the received commands into more detailed processes, and then issues instructions to various modules to perform tasks to complete the requested operations. A sense processor is one such module, and is a type of sub-controller for sense amplifiers and data latches.

In embodiments, the microcontroller sends commands to the sense processor to perform state machine controller bus operations, which are part of the process of control of sense amplifiers and data latches. In embodiments, each state machine controller bus operation includes sets of commands, and each set of commands includes one or more instructions (e.g., OPcodes).

Conventionally, the sense amplifier provides a control signal to the microcontroller to indicate when the sense amplifier has completed executing a set of commands so that the microcontroller can send a next consecutive set of commands. As a result of signal propagation delays and signal handshaking between the microcontroller and the sense processor there is a time interval during which the sense processor does not execute any commands. This time interval is overhead that impacts the time required to perform programming operations, such as programming time.

Technology is described for eliminating this overhead. In embodiments, before completes executing a set of commands the sense amplifier provides a control signal to the microcontroller to indicate that the microcontroller can send a next consecutive set of commands. Without wanting to be bound by any particular theory, it is believed that this will allow the sense amplifier to execute state machine controller bus operations back-to-back, eliminating overhead.

Figure 1A:
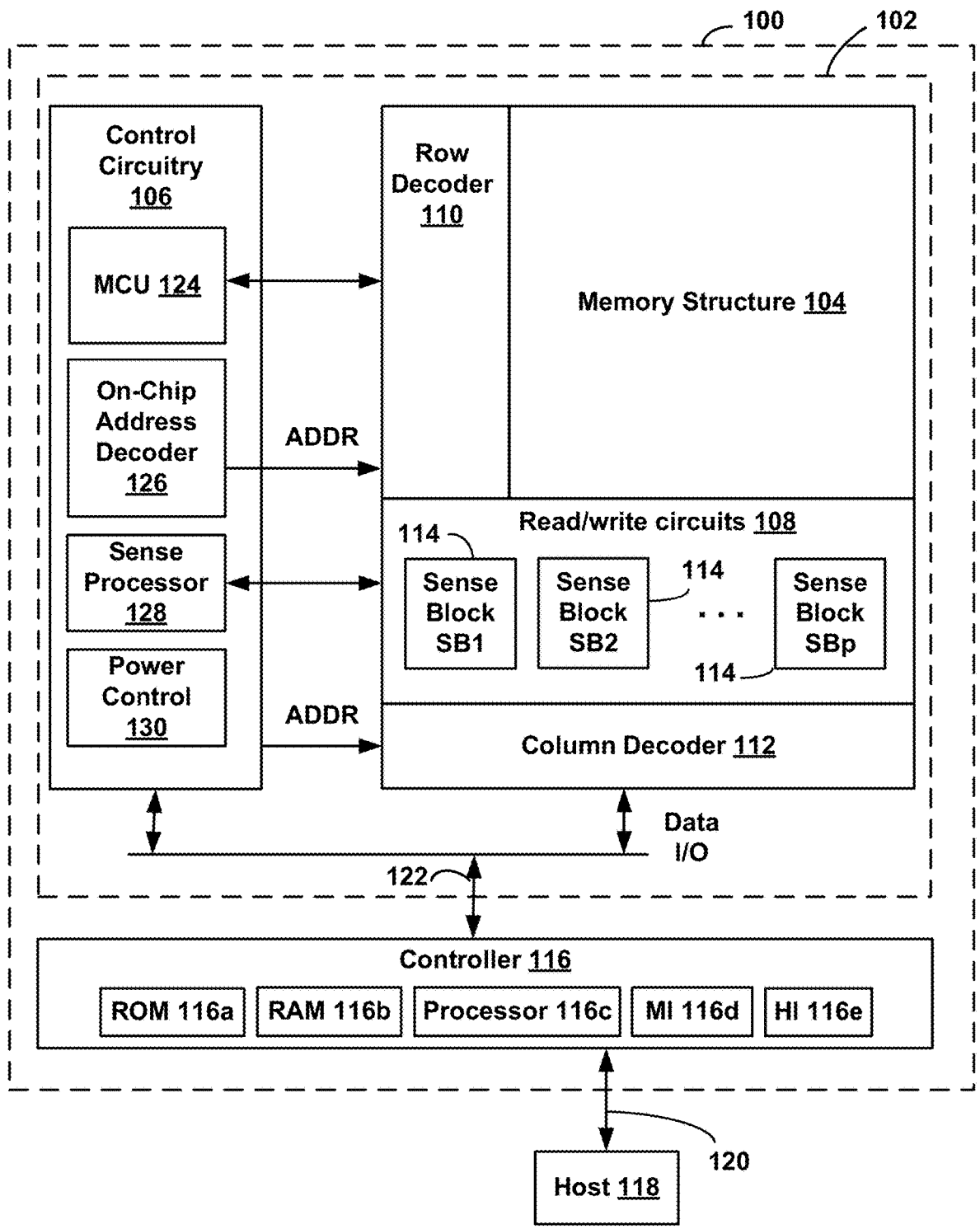
FIG. 1A is a functional block diagram of a memory device.
Figure 1B:
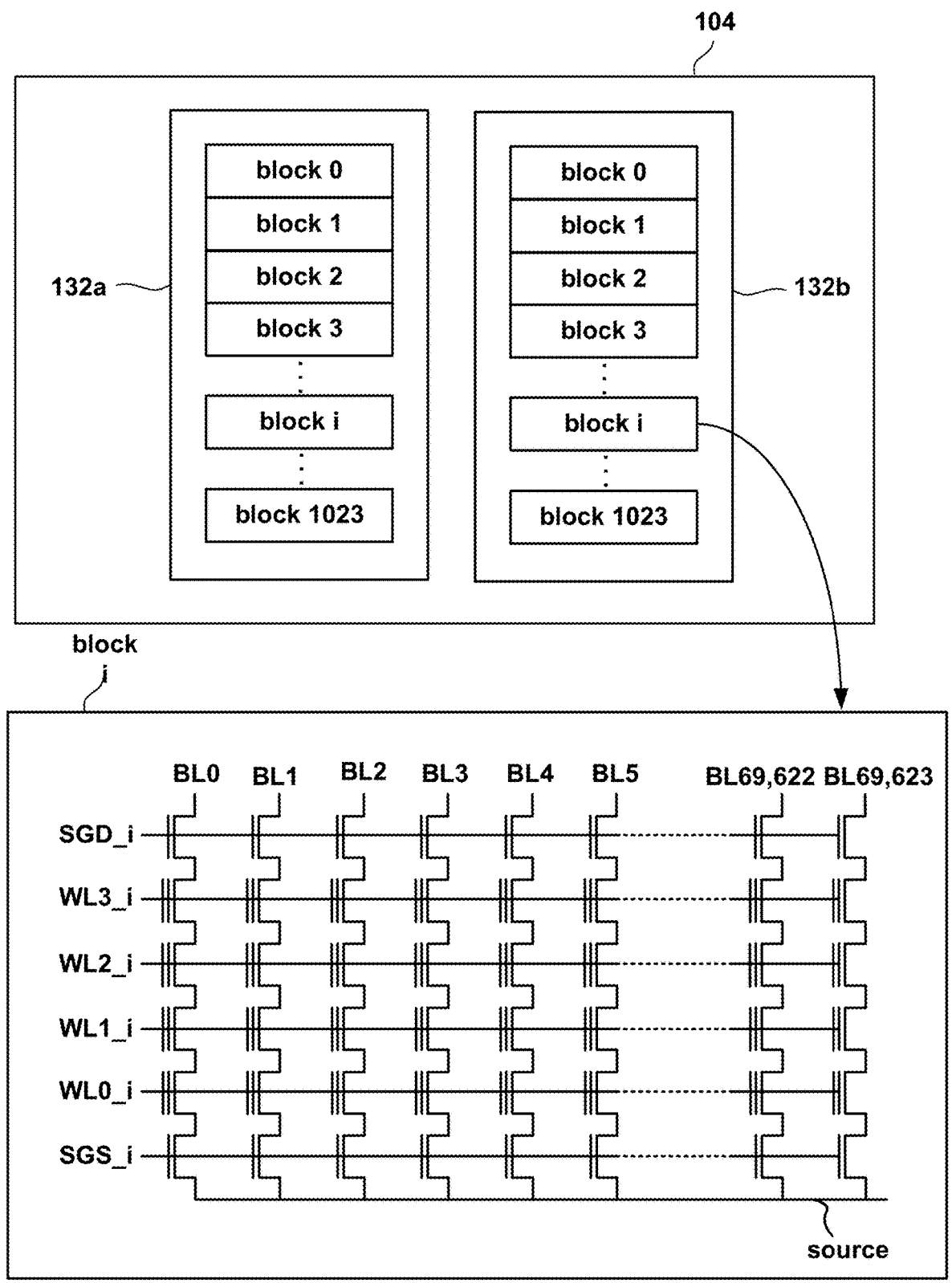
FIG. 1B is a block diagram depicting one example of a memory structure.
Figure 1C:
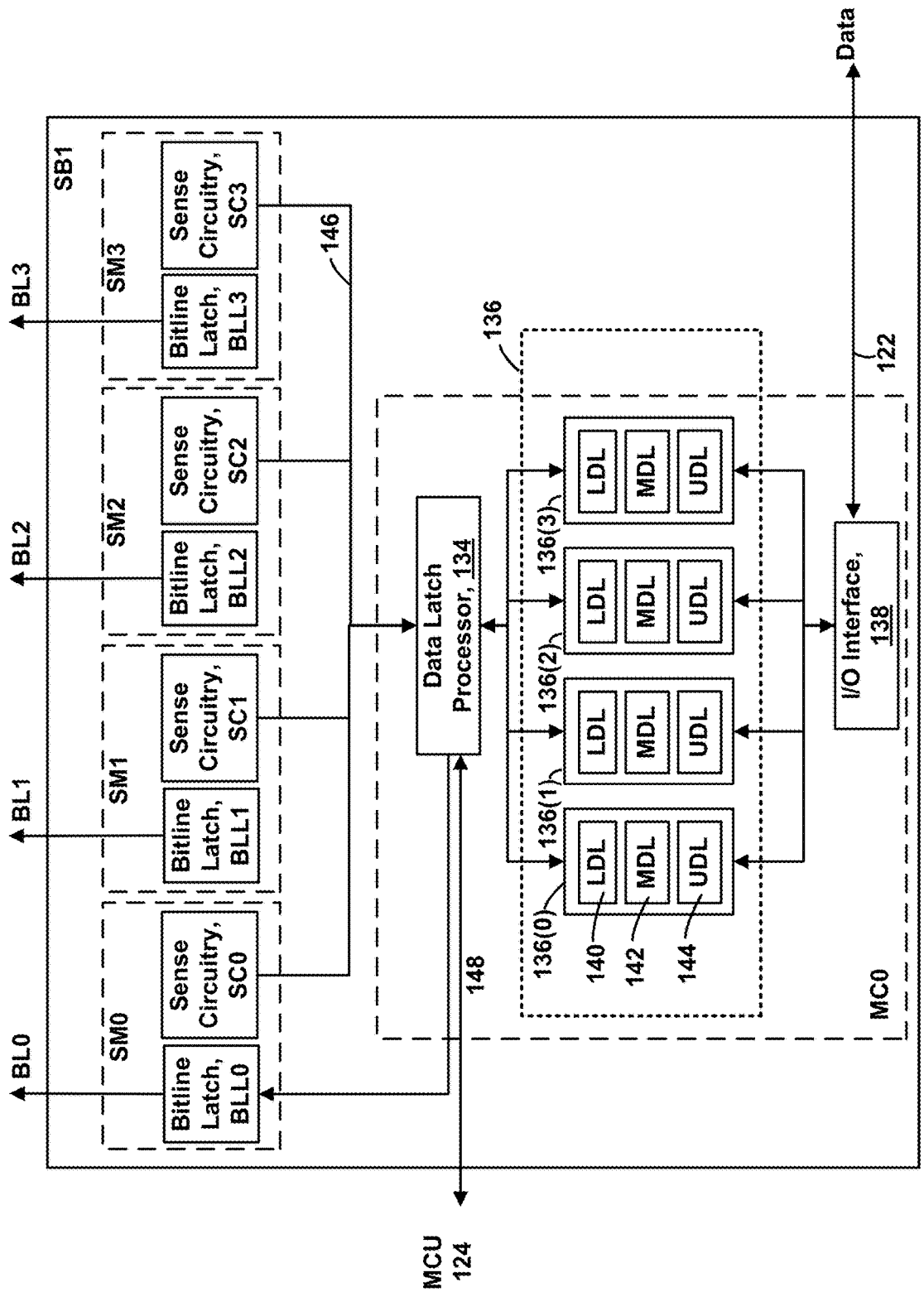
FIG. 1C is a block diagram depicting an embodiment of a sense block SB1 of FIG. 1A.
Figure 2:
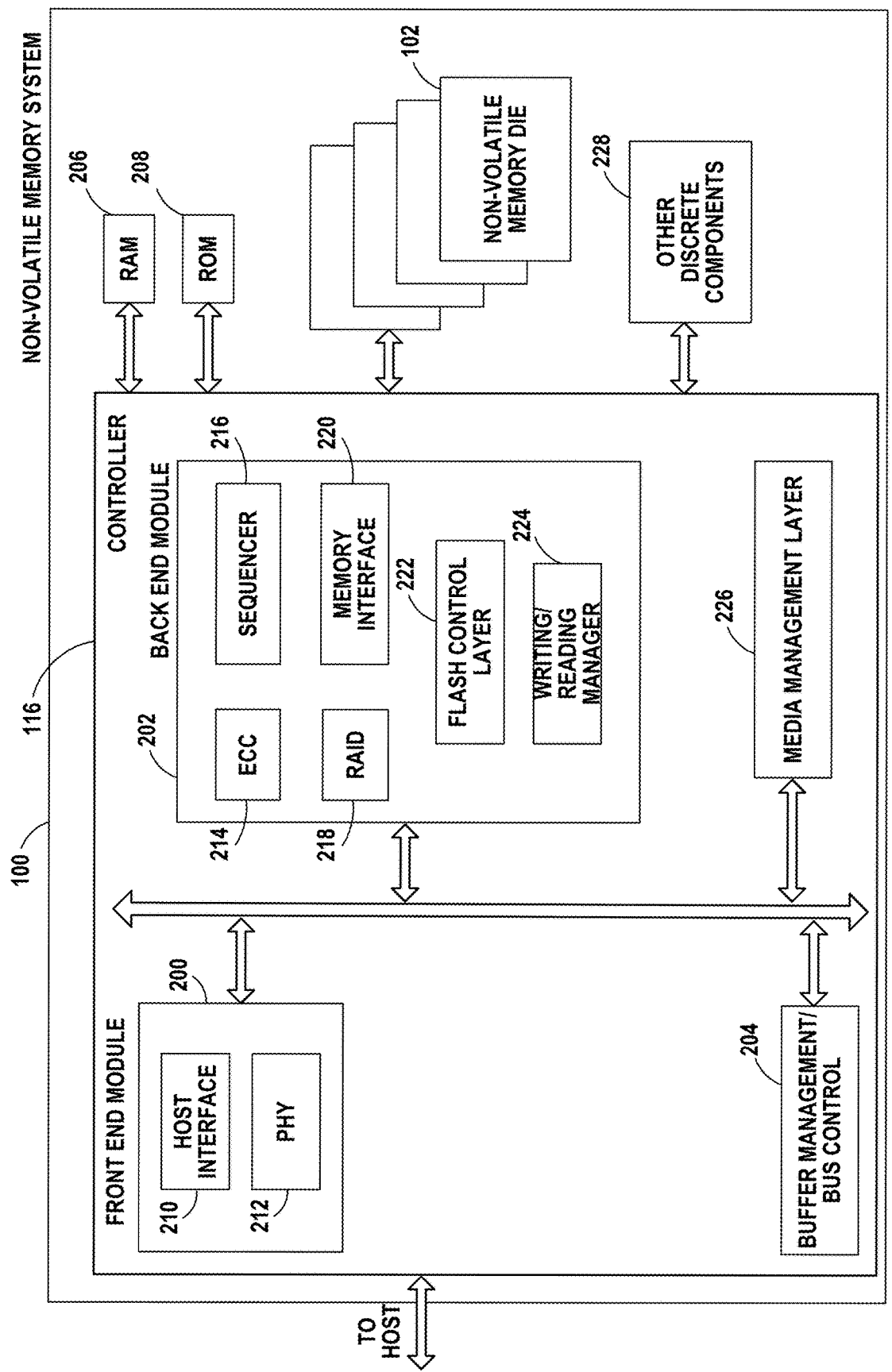
FIG. 2 is a block diagram depicting one embodiment of a memory system.

FIGS. 1A-2 describe one set of examples of a memory system that can be used to implement the technology described herein. FIG. 1A is a functional block diagram of an example memory system 100. Memory system 100 includes one or more memory die 102. Memory die 102 can be complete memory die or partial memory die.

In an embodiment, each memory die 102 includes a memory structure 104, control circuitry 106, and read/write circuits 108. Memory structure 104 is addressable by word lines via a row decoder 110 and by bit lines via a column decoder 112. Read/write circuits 108 include multiple sense blocks 114 including SB1, SB2 .... SBp (sensing circuitry) and allow a page of memory cells to be read or programmed in parallel. In an embodiment, sense blocks 114 include sense amplifiers, data latches and bit line drivers. In other embodiments, sense blocks 114 may include additional and/or different sense amplifier circuitry.

In some systems, a controller 116 is included in the same package (e.g., a removable storage card) as memory die 102. However, in other systems, controller 116 can be separate from memory die 102. In some embodiments controller 116 will be on a different die than memory die 102. In some embodiments, a single controller 116 will communicate with multiple memory die 102. In other embodiments, each memory die 102 has its own controller.

Commands and data are transferred between a host 118 and controller 116 via a data bus 120, and between controller 116 and memory die 102 via lines 122. In an embodiment, memory die 102 includes a set of input and/or output (I/O) pins that connect to lines 122.

Control circuitry 106 cooperates with the read/write circuits 108 to perform memory operations (e.g., write, read, and others) on memory structure 104, and includes a programmable and reprogrammable microcontroller (MCU) 124, an on-chip address decoder 126, a sense processor 128, and a power control circuit 130.

In an embodiment, MCU 124 provides die-level control of memory operations. In an embodiment, MCU 124 is programmable by software. In other embodiments, MCU 124 does not use software and is completely implemented in hardware (e.g., electrical circuits). In an embodiment, control circuitry 106 includes buffers such as registers, ROM fuses and other storage devices for storing default values such as base voltages and other parameters.

On-chip address decoder 126 provides an address interface between addresses used by host 118 or controller 116 to the hardware address used by row decoder 110 and column decoder 112. Sense processor 128 is a sub-controller for sense amplifiers and data latches in sense blocks 114. Power control circuit 130 controls the power and voltages supplied to the word lines and bit lines during memory operations. Power control circuit 130 may include charge pumps for creating voltages.

MCU 124 and/or controller 116 (or equivalently functioned circuits) can be considered a control circuit that performs the functions described herein. The control circuit can include hardware only or a combination of hardware and software (including firmware).

For example, a controller programmed by firmware to perform the functions described herein is one example of a control circuit. A control circuit can include a processor, Field Programmable Gate Array (FGA), Application Specific Integrated Circuit (ASIC), integrated circuit or other type of circuit.

In an embodiment, control circuitry 106 (including MCU 124), read/write circuits 108, row decoder 110 and column decoder 112 are positioned on a substrate and are disposed underneath memory structure 104.

Controller 116 (which in one embodiment is an electrical circuit) may include one or more processors 116*c*, ROM 116*a*, RAM 116*b*, a memory interface (MI) 116*d* and a host interface (HI) 116*e*, all of which are interconnected. The storage devices (ROM 116*a*, RAM 116*b*) store code (software) such as a set of instructions (including firmware), and one or more processors 116*c* is/are operable to execute the set of instructions to provide the functionality described herein.

Alternatively or additionally, one or more processors 116*c* can access code from a storage device in memory structure 104, such as a reserved area of memory cells connected to one or more word lines. RAM 116*b* can be to store data for controller 116, including caching program data (discussed below).

Memory interface 116*d*, in communication with ROM 116*a*, RAM 116*b* and processor 116*c*, is an electrical circuit that provides an electrical interface between controller 116 and memory die 102. For example, memory interface 116*d* can change the format or timing of signals, provide a buffer, isolate from surges, latch I/O, etc.

One or more processors 116*c* can issue commands to control circuitry 106 (or another component of memory die 102) via memory interface 116*d*. Host interface 116*e* provides an electrical interface with host 118 via data bus 120 to receive commands, addresses and/or data from host 118 to provide data and/or status to host 118.

In an embodiment, memory structure 104 includes a three dimensional memory array of non-volatile memory cells in which multiple memory levels are formed above a substrate, such as a wafer. Memory structure 104 may include any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 104 includes a two dimensional memory array of non-volatile memory cells. In one example, the non-volatile memory cells are NAND flash memory cells utilizing floating gates. Other types of memory cells (e.g., NOR-type flash memory) also can be used.

The exact type of memory array architecture or memory cell included in memory structure 104 is not limited to the examples above. Many different types of memory array architectures or memory technologies can be used to form memory structure 104. No particular non-volatile memory technology is required for purposes of the new claimed embodiments proposed herein.

Other examples of suitable technologies for memory cells of memory structure 104 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of memory structure 104 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines).

In another embodiment, the memory cells may include conductive bridge memory elements. A conductive bridge memory element also may be referred to as a programmable metallization cell. A conductive bridge memory element may be used as a state change element based on the physical relocation of ions within a solid electrolyte.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity, and the magnetization of the other plate can be changed to match that of an external field to store memory. A memory device is built from a grid of such memory cells.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). The memory cells can be inhibited by blocking the memory cells from receiving the light.

A person of ordinary skill in the art will recognize that the technology described herein is not limited to a single specific memory structure, but covers many relevant memory structures within the spirit and scope of the technology as described herein and as understood by one of ordinary skill in the art.

FIG. 1B depicts an example of memory structure 104. In one embodiment, an array of memory cells is divided into multiple planes. In the example of FIG. 1B, memory structure 104 is divided into two planes: plane 132*a* and plane 13*b*2. In other embodiments, more or less than two planes can be used. In some embodiments, each plane is divided into a number of memory erase blocks (e.g., blocks 0-1023, or another amount).

In certain memory technologies (e.g., 2D/3D NAND and other types of flash memory), a memory erase block is the smallest unit of memory cells for an erase operation. That is, each erase block contains the minimum number of memory cells that are erased together in a single erase operation. Other units of erase also can be used. In other memory technologies (e.g., MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 104. As used herein, a memory erase block is a contiguous set of memory cells that share word lines and bit lines. For example, erase block i of FIG. 1B includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1B shows four memory cells connected in series to form a NAND string, although each NAND string may include more or less than four memory cells. One terminal of the NAND string is connected to a corresponding bit line via a drain select gate, and another terminal is connected to the source line via a source select gate. Although FIG. 1B shows 69624 bit lines, a different number of bit lines also can be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells.

For example, one or more pages of data may be stored in memory cells connected to a common word line. A page includes user data and overhead data (also called system data). Overhead data typically includes header information and an Error Correction Code (ECC) that has calculated from the user data of the sector. The controller (or other component) calculates the ECC when data are being written into the array, and also checks the ECC when data are being read from the array. In one embodiment, a page includes data stored in all memory cells connected to a common word line.

In the example discussed above, the unit of erase is a memory erase block and the unit of programming and reading is a page. Other units of operation also can be used. Data can be stored/written/programmed, read or erased a byte at a time, 1K bytes, 512K bytes, etc. No particular unit of operation is required for the claimed solutions described herein.

In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

FIG. 1C is a block diagram depicting one embodiment of the sense block SB1 of FIG. 1A. Sense block SB1 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 146. Thus, there are one or more managing circuits which communicate with the sense modules of a set of memory cells.

Each sense module SM0, SM1, SM2 and SM3 includes sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage).

Each sense module SM0, SM1, SM2 and SM3 also includes a bit line latch BLL0, BLL1, BLL2 and BLL3, respectively, that is used to set a voltage condition on the connected bit line. For example, during a programming operation, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 includes a data latch processor 134, data latches 136 including four example sets of data latches 136(0), 136(1), 136(2) and 136(3) and an I/O interface 138 coupled between the sets of data latches 136 and lines 122. In this example, each set of data latches 136 is associated with one of the bit lines. For example, data latches 136(0) are associated with bit line BL0, data latches 136(1) are associated with bit line BL1, data latches 136(2) are associated with bit line BL2, and data latches 136(3) are associated with bit line BL3.

Each set of data latches includes data latches identified by LDL 140, MDL 142, and UDL 144, in this embodiment. LDL 140 stores a bit for a lower page of write data, MDL 142 stores a bit for a middle page of write data, and UDL 144 stores a bit for an upper page of write data, in a memory which stores three bits of data in each memory cell. Note that there may be one set of such latches associated with each bit line. Data latches 136 also may be used to store data read from the non-volatile memory cells.

Additional or fewer data latches per set could be used as well. For example, in a two-bit per memory cell implementation, the MDL data latch for the middle page of data is not needed. A four-bit per memory cell implementation can use LDL, LMDL (lower-middle page), UMDL (upper-middle page), and UDL latches. The techniques provided herein are meant to encompass such variations.

Data latch processor 134 performs computations during reading and programming. For reading, data latch processor 134 determines the data state stored in the sensed memory cell and stores the data in the set of data latches. For full programming and refresh programming, data latch processor 134 reads the latches to determine the data state which is to be written to a memory cell.

During reading, the operation of the system is under the control of MCU 124 which controls the supply of different control gate voltages to the addressed memory cell. As it steps through the various predefined control gate voltages corresponding to the various memory states supported by the memory, the sense module may trip at one of these voltages and a corresponding output will be provided from the sense module to data latch processor 134 via data bus 146. At that point, data latch processor 134 determines the memory state by considering the tripping event(s) of the sense module and the information about the applied control gate voltage from MCU 124 via input lines 148.

Data latch processor 134 then computes a binary encoding for the memory state and stores the resultant data bits into the data latches 136. For example, the memory state for a memory cell associated with bit line BL0 may be stored in data latches 136(0), etc. Herein, a "memory state" may also be referred to as a "data state." In another embodiment of the managing circuit MC0, the bit line latch serves both as a latch for latching the output of the sense module and also as a bit line latch as described above.

In an embodiment, MCU 124 executes instructions to control data latch processor 134 to determine a data state (e.g., S0-S7 in FIG. 4) of memory cells. The data state may be defined by a range of some physical parameter including, but not limited to, transistor threshold voltage, resistance, or current. Thus, to determine a data state means to determine what range of a certain physical parameter a memory cell is in.

In an embodiment, MCU 124 executes instructions to control data latch processor 134 to determine whether a memory cell conducts a current in response to voltages applied to the memory cell. In an embodiment, MCU 124 executes instructions to control data latch processor 134 to determine whether the threshold voltage of a memory cell is above or below a reference voltage applied to the memory cell.

During program or verify operations, the data to be programmed (write data) are stored in data latches 136 from lines 122, in the LDL, MDL, and UDL data latches. For example, the data to be programmed in a selected memory cell associated with bit line BL0 may be stored in data latches 136(0), the data to be programmed in a selected memory cell associated with bit line BL1 may be stored in data latches 136(1), etc.

The programming operation, under the control of MCU 124, includes a series of programming voltage pulses applied to the control gates of the addressed memory cells. Each programming voltage is followed by a read back (verify test) to determine if the memory cell has been programmed to the desired memory state.

In some cases, data latch processor 134 monitors the read back memory state relative to the desired memory state. When the two states agree, data latch processor 134 sets the bit line latch to cause the bit line to be pulled to a state designating program inhibit (e.g., 2-3V). This inhibits the memory cell coupled to the bit line from further programming even if programming voltages appear on its control gate. In other embodiments, data latch processor 134 initially loads the bit line latch, and the sense circuitry sets the bit line latch to an inhibit value during the verify process.

Each set of data latches 136 may be implemented as a stack of data latches for each sense module. In some implementations, the data latches are implemented as a shift register so that the parallel data stored therein is converted to serial data for lines 122, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 2 is a block diagram of example memory system 100, depicting more details of one embodiment of controller 116 of FIG. 1A. In an embodiment, controller 116 is a flash memory controller. Memory die 102 is not limited to flash memory technology. Thus, controller 116 is not limited to the example of a flash memory controller. As used herein, a flash memory controller is a device that manages data stored in flash memory and communicates with a host, such as a computer or electronic device.

A flash memory controller can have various functionality in addition to the specific functionality described herein. For example, a flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features.

In operation, when a host needs to read data from or write data to the flash memory, the host will communicate with the flash memory controller. If the host provides a logical address to which data are to be read/written, the flash memory controller can convert the logical address received from the host to a physical address in the flash memory.

The flash memory controller also can perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 116 and memory die 102 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

As depicted in FIG. 2, controller 116 includes a front end module 200 that interfaces with a host, a back end module 202 that interfaces with memory die 102, and various other modules that perform functions described below. The components of controller 116 depicted in FIG. 2 may include an ASIC, an FPGA, a circuit, a digital logic circuit, an analog circuit, a combination of discrete circuits, gates, or any other type of hardware or combination thereof.

Alternatively or in addition, each module may include software stored in a processor readable device (e.g., memory) to program a processor for controller 116 to perform the functions described herein. The architecture depicted in FIG. 2 is one example implementation that may (or may not) use the components of controller 116 depicted in FIG. 1A (i.e., RAM, ROM, processor, interface).

Referring again to modules of controller 116, a buffer management/bus control 204 manages buffers in random access memory (RAM) 206 and controls the internal bus arbitration of controller 116. A read only memory (ROM) 208 stores system boot code. Although illustrated in FIG. 2 as located separately from controller 116, in other embodiments one or both of the RAM 206 and ROM 208 may be located within controller 116. In yet other embodiments, portions of RAM and ROM may be located both within controller 116 and outside controller 116. Further, in some implementations, controller 116, RAM 206, and ROM 208 may be located on separate semiconductor die.

Front end module 200 includes a host interface 210 and a physical layer interface (PHY) 212 that provide the electrical interface with the host or next level storage controller. The choice of the type of host interface 210 can depend on the type of memory being used. Examples of host interfaces 210 include, but are not limited to, SATA, SATA Express, SAS, Fibre Channel, USB, PCIe, and NVMe. Host interface 210 typically facilitates transfer for data, control signals, and timing signals.

Back end module 202 includes an ECC engine 214 that encodes the data bytes received from the host, and decodes and error corrects the data bytes read from the non-volatile memory. A command sequencer 216 generates command sequences, such as program and erase command sequences, to be transmitted to memory die 102. A RAID module 218 manages generation of RAID parity and recovery of failed data. In some cases, RAID module 218 may be a part of ECC engine 214.

A memory interface 220 provides the command sequences to memory die 102 and receives status information from memory die 102. In one embodiment, memory interface 220 may be a double data rate (DDR) interface, such as a Toggle Mode 200, 400, or 800 interface. A flash control layer 222 controls the overall operation of back end module 202.

One embodiment includes a writing/reading manager 224, which can be used to manage (in conjunction with the circuits on the memory die) the writing and reading of memory cells. In some embodiments, writing/reading manager 224 performs the processes depicted in the flow charts described below.

Additional components of system 100 illustrated in FIG. 2 include media management layer 226, which performs wear leveling of memory cells of memory die 102. System 100 also includes other discrete components 228, such as external electrical interfaces, external RAM, resistors, capacitors, or other components that may interface with controller 116. In alternative embodiments, one or more of physical layer interface 212, RAID module 218, media management layer 226 and buffer management/bus controller 204 are optional components that are not necessary in controller 116.

The Flash Translation Layer (FTL) or Media Management Layer (MML) 226 may be integrated as part of the flash management that may handle flash errors and interfacing with the host. In particular, MML 226 may be a module in flash management and may be responsible for the internals of NAND management. In particular, MML 226 may include an algorithm in the memory device firmware which translates writes from the host into writes to memory structure 104 of memory die 102.

MML 226 understands these potential limitations of memory structure 104 which may not be visible to the host. Accordingly, MML 226 attempts to translate writes from host into writes into memory structure 104.

Controller 116 may interface with memory die 102. In one embodiment, controller 116 and multiple memory die (together comprising non-volatile storage system 100) implement an SSD, which can emulate, replace or be used instead of a hard disk drive inside a host, as a NAS device, in a laptop, in a tablet, in a server, etc.

Some embodiments of a non-volatile storage system include a memory die 102 connected to one controller 116. However, other embodiments may include multiple memory die 102 in communication with one or more controllers 116. In one example, the multiple memory die 102 can be grouped into a set of memory packages. Each memory package includes one or more memory die in communication with controller 116.

In one embodiment, a memory package includes a printed circuit board (or similar structure) with one or more memory die mounted thereon. In some embodiments, a memory package can include molding material to encase the memory dies of the memory package. In some embodiments, controller 116 is physically separate from any of the memory packages.

The memory systems discussed above can be erased, programmed/written and read. At the end of a successful programming process (with verification), the threshold voltages of the memory cells should be within one or more distributions of threshold voltages for programmed memory cells or within a distribution of threshold voltages for erased memory cells, as appropriate.

Figure 3:
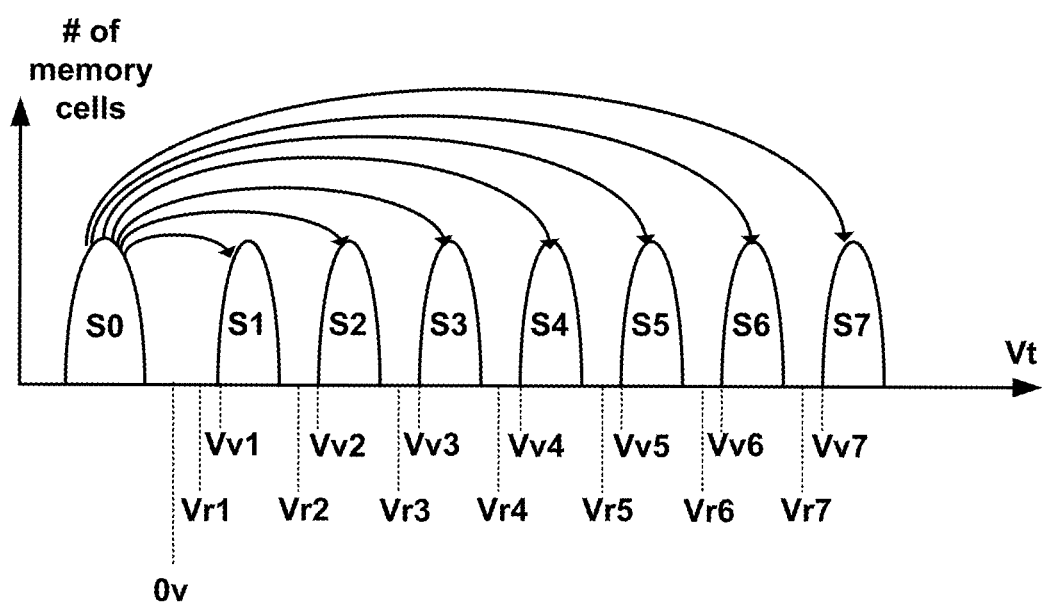
FIG. 3 depicts example threshold voltage distributions.

FIG. 3 illustrates example threshold voltage distributions for a memory cell array in which each memory cell stores three bits of data. Other embodiments, however, may use other data capacities per memory cell (e.g., such as one, two, four, or five bits of data per memory cell).

FIG. 3 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, also are called programmed states. Each threshold voltage distribution (data state) corresponds to predetermined values for the set of data bits.

The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 3 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (e.g., S0, S1, S2, S3, . . . ) a memory cell is in.

FIG. 3 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2, and so on.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7.

For example, while some memory cells are being programmed from data state S0 to data state S1, other memory cells are being programmed from data state S0 to data state S2 and/or from data state S0 to data state S3, and so on. The arrows of FIG. 3 represent full sequence programming. The technology described herein also can be used with other types of programming in addition to full sequence programming (including, but not limited to, multiple stage/phase programming). In some embodiments, data states S1-S7 can overlap, with controller 116 relying on ECC to identify the correct data being stored.

In one embodiment, when a block is subjected to an erase operation, all memory cells are moved to data state S0, the erased state. The proposed technology described herein can be used for embodiments in which each memory cell stores one bit of data per memory cell (also referred to as SLC) and for embodiments in which each memory cell stores multiple bits of data per memory cell (FIG. 3). When memory cells store one bit of data per memory cell, there may be two data states. When memory cells store two bits of data per memory cell, there may be four data states.

Figure 4:
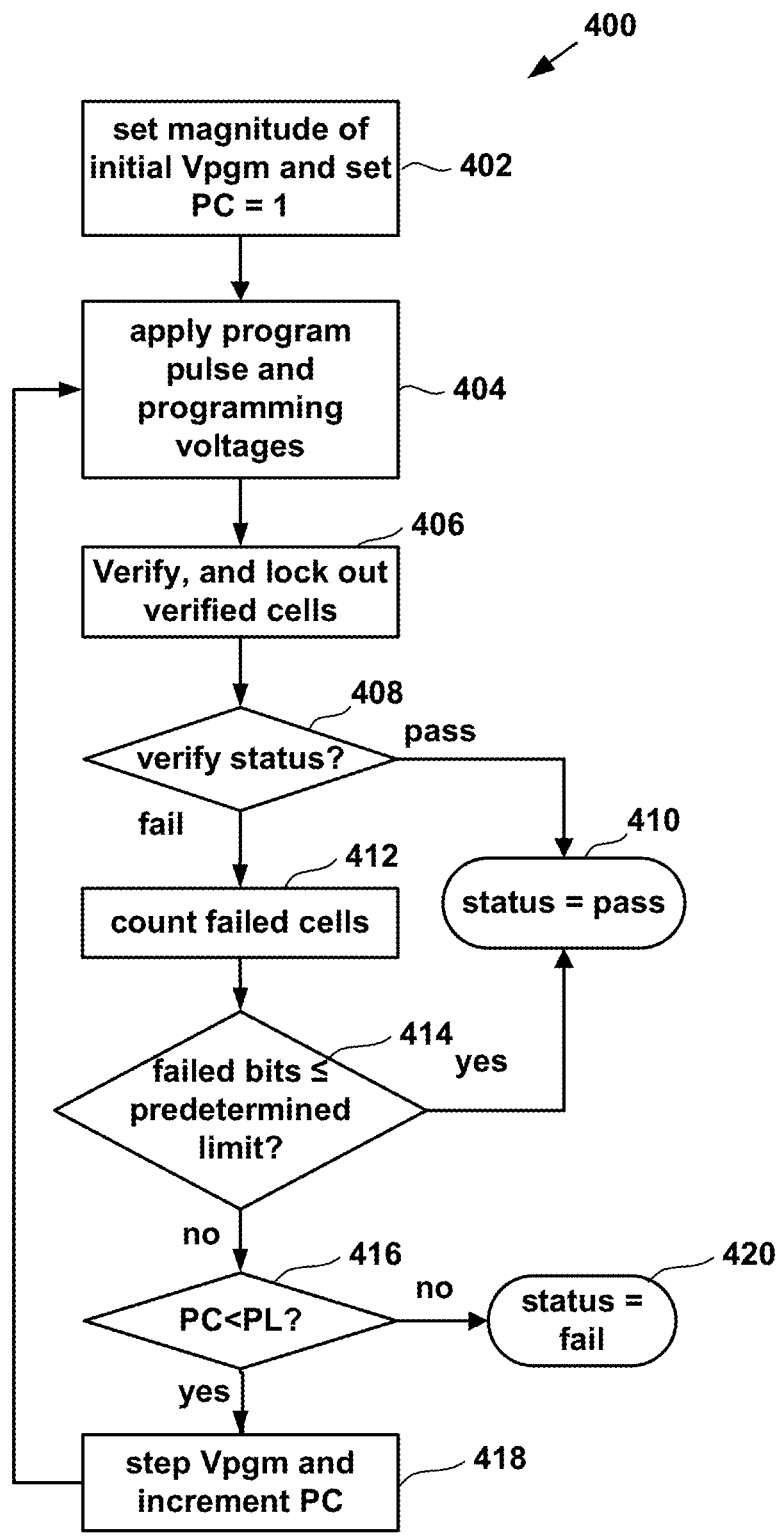
FIG. 4 is a flow chart describing one embodiment of a process for programming/writing data into memory cells connected to a common word line.

FIG. 4 is a flowchart describing one embodiment of a process 400 for programming. In one example embodiment, the process of FIG. 4 is performed on memory die 102 using the one or more control circuits discussed above, at the direction of MCU 124. The process of FIG. 4 also can be used to implement the full sequence programming discussed above. The process of FIG. 4 also can be used to implement each phase of a multi-phase programming process. Additionally, the process of FIG. 4 can be used to program memory cells connected to the same word line with one bit of data per memory cell.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size.

In step 402 of FIG. 4, the programming voltage (Vpgm) is initialized to a starting magnitude (e.g., ~12-16V or another suitable level) and a program counter PC maintained by MCU 124 is initialized at 1.

In one embodiment, the group of memory cells being programmed concurrently are all connected to the same word line (the selected word line). In step 404, a program pulse of the program signal Vpgm is applied to the selected word line. The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming.

In step 404, the program pulse is concurrently applied to all memory cells connected to the selected word line. That is, the memory cells connected to the selected word line are programmed at the same time or during overlapping times (both of which are considered concurrent). In this manner all of the memory cells connected to the selected word line will concurrently have their threshold voltage change, unless they have been locked out from programming.

In step 406, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 408, it is determined whether all the memory cells have reached their target threshold voltages (pass). If so, the programming process is complete and successful because all selected memory cells were programmed and verified to their target data states. A status of "PASS" is reported in step 410. If, in 408 it is determined that not all of the memory cells have reached their target threshold voltages (fail), then the programming process continues to step 412.

In step 412, the system counts the number of memory cells that have not yet reached their respective target threshold voltage distribution. That is, the system counts the number of memory cells that have, so far, failed the verify process. This counting can be performed by MCU 124, controller 116, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 414, it is determined whether the count from step 412 is less than or equal to a predetermined limit. In one embodiment, the predetermined limit is the number of bits that can be corrected by ECC during a read process for the page of memory cells. If the number of failed memory cells is less than or equal to the predetermined limit, than the programming process can stop and a status of "PASS" is reported in step 410.

In this situation, enough memory cells programmed correctly such that the few remaining memory cells that have not been completely programmed can be corrected using ECC during the read process. In some embodiments, step 412 will count the number of failed cells for each sector, each target data state or other unit, and those counts will individually or collectively be compared to a threshold in step 414.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, then the programming process continues at step 416 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788.

If the program counter PC is less than the program limit value PL, then the process continues at step 418 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 418, the process loops back to step 404 and another program pulse is applied to the selected word line so that another iteration (steps 404-418) of the programming process of FIG. 4 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 3) or verify operation (e.g., see verify reference voltages Vv1, Vv2, Vv3, Vv4, Vv5, Vv6, and Vv7 of FIG. 3) to determine whether a threshold voltage of the concerned memory cell has reached such level. After applying the word line voltage, the conduction current of the memory cell is measured to determine whether the memory cell turned on (conducted current) in response to the voltage applied to the word line.

If the conduction current is measured to be greater than a certain value, then it is assumed that the memory cell turned ON and the voltage applied to the word line is greater than the threshold voltage of the memory cell. If the conduction current is not measured to be greater than the certain value, then it is assumed that the memory cell did not turn ON and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in a sense amplifier.

In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 116 receives a request from the host (or a client, user, etc.) to program host data (data received from the host) into the memory system. In some embodiments, controller 116 arranges the host data to be programmed into units of data. For example, controller 116 can arrange the host data into pages, partial pages (a subset of a page), word line units, blocks, jumbo blocks, or other units.

Step 404 of FIG. 4 includes applying a program voltage pulse on the selected word line. Step 406 of FIG. 4 includes verification, which in some embodiments comprises applying the verify reference voltages on the selected word line. As steps 404 and 406 are part of an iterative loop, the program voltage is applied as a series of voltage pulses that step up in magnitude. Between voltage pulses, verify reference voltages are applied.

Referring again to FIG. 1A, and as described above, MCU 124 provides die-level control of memory operations. In an embodiment, MCU 124 receives memory operation commands (e.g., read, program) from Host 118, breaks down the received commands into more detailed processes, and then issues instructions to various modules to perform tasks to complete the requested operations. In an embodiment, sense processor 128 is one such module, and is a type of sub-controller for sense amplifiers and data latches in sense blocks 114.

Figure 5A:
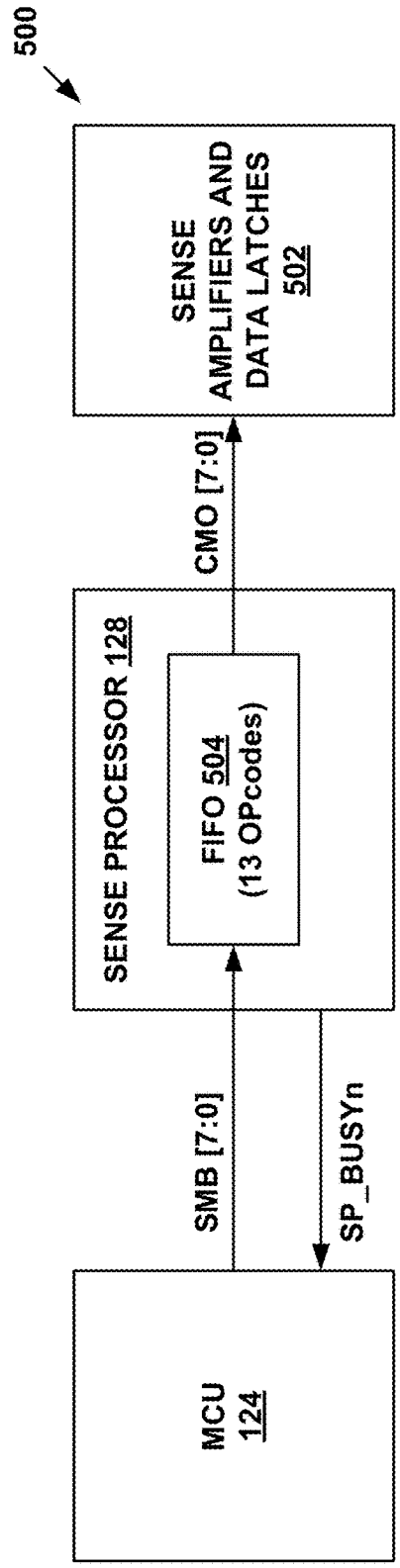
FIG. 5A is a simplified block diagram depicting an example implementation of a microcontroller and a sense processor of FIG. 1A for controlling sense amplifiers and data latches.

FIG. 5A is a simplified block diagram depicting an example system 500 for controlling sense amplifiers and data latches. System 500 includes MCU 124, sense processor 128 and sense amplifiers and data latches 502. In embodiments, sense blocks 114 of FIG. 1A include sense amplifiers and data latches 502. In an embodiment, sense processor 128 includes a first-in first-out (FIFO) circuit 504.

In an embodiment, MCU 124 sends commands to sense processor 128 to perform state machine controller bus (SMB) operations. In an embodiment, an SMB operation is part of the process of control of sense amplifiers and data latches 502, and includes sets of commands.

In an embodiment, each set of commands includes one or more instructions, and is referred to herein as a "Condition." In an embodiment, each instruction is referred to herein as an OPcode. In an embodiment, MCU 124 sends Conditions to sense processor 128, and sense processor 128 performs SMB operations specified in the Conditions to control sense amplifiers and data latches 502.

In an embodiment, MCU 124 provides at a first output terminal an 8-bit signal SMB[7:0] to an input terminal of FIFO circuit 504 of sense processor 128. In an embodiment, sense processor 128 provides at an output terminal of FIFO circuit 504 an 8-bit signal CMO[7:0] to an input terminal of sense amplifiers and data latches 502. In an embodiment, sense processor 128 provides at an output terminal a signal SP_Busyn to an input terminal of MCU 124.

In the illustrated example, each Condition includes one or more 8-bit OPcodes, and MCU 124 sends commands to sense processor 128 via 8-bit bus SMB[7:0]. Persons of ordinary skill in the art will understand that the SMB bus may have fewer than or more than 8 bits. In the illustrated example, sense processor 128 sends control signals to sense amplifiers and data latches 502 via 8-bit bus CMO[7:0]. Persons of ordinary skill in the art will understand that the CMO bus may have fewer than or more than 8 bits.

Figure 5B:
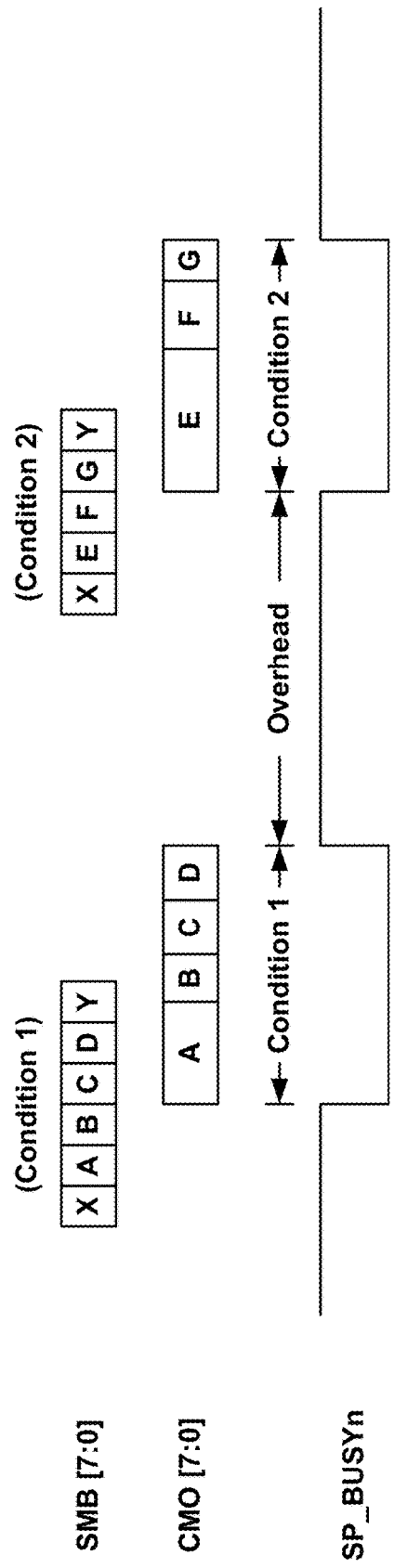
FIG. 5B illustrates two example conditions for the circuits of FIG. 5A.

FIG. 5B illustrates two example Conditions—Condition 1 and Condition 2 for the circuits of FIG. 5A. In the illustrated example, Condition 1 includes a preamble (X), four OPcodes (ABCD) and a frame check (Y). Similarly, Condition 2 includes preamble (X), three OPcodes (EFG) and frame check (Y). Persons of ordinary skill in the art will understand that Conditions may include fewer than three and more than four OPcodes.

Referring again to FIG. 5A, the OPcodes that sense processor 128 receives from MCU 124 are stored in FIFO circuit 504. In an embodiment, each Condition includes a maximum of $O_{MAX}=13$ OPcodes. Thus, in an embodiment FIFO circuit 504 is configured to have $O_{MAX}=13$ registers for storing the maximum number of OPcodes $O_{MAX}=13$ for any Condition. In other embodiments, $O_{MAX}$ may have more or fewer than 13 OPcodes.

In an embodiment, sense processor 128 sequentially executes each OPcode one at a time. Referring again to FIG. 5B, the signal CMO[7:0] depicts the timing of the execution of each OPcode by sense processor 128. In an embodiment, prior to operation of each Condition, sense processor 128 causes signal SP_Busyn to have a first value (e.g., HIGH). During the operation of each Condition, sense processor 128 causes signal SP_Busyn to a second value (e.g., LOW).

In this regard, sense processor 128 notifies MCU 124 when the OPcodes of a Condition are being executed via signal SP_Busyn. In an embodiment, when signal SP_Busyn is HIGH, sense processor 128 is not executing any OPcodes of a Condition, whereas when SP_Busyn is LOW, sense processor 128 is executing any OPcodes of a Condition. In an embodiment, MCU 124 can send Conditions to sense processor 128 only when signal SP_Busyn is HIGH.

As a result of signal propagation delays and signal handshaking between MCU 124 and sense processor 128, there is a time interval (labeled "Overhead" in FIG. 5B) during which sense processor 128 does not execute OPcodes of any Condition. In an embodiment, the Overhead is on the order of about 600 ns, although the Overhead may be more or less than 600 ns.

A consequence of this Overhead is that time required to perform memory operations (e.g., programming) is longer than it otherwise would be in the absence of such Overhead. Thus, reducing or eliminating the Overhead may improve memory operation data rates (e.g., programming data rates).

Figure 6A:
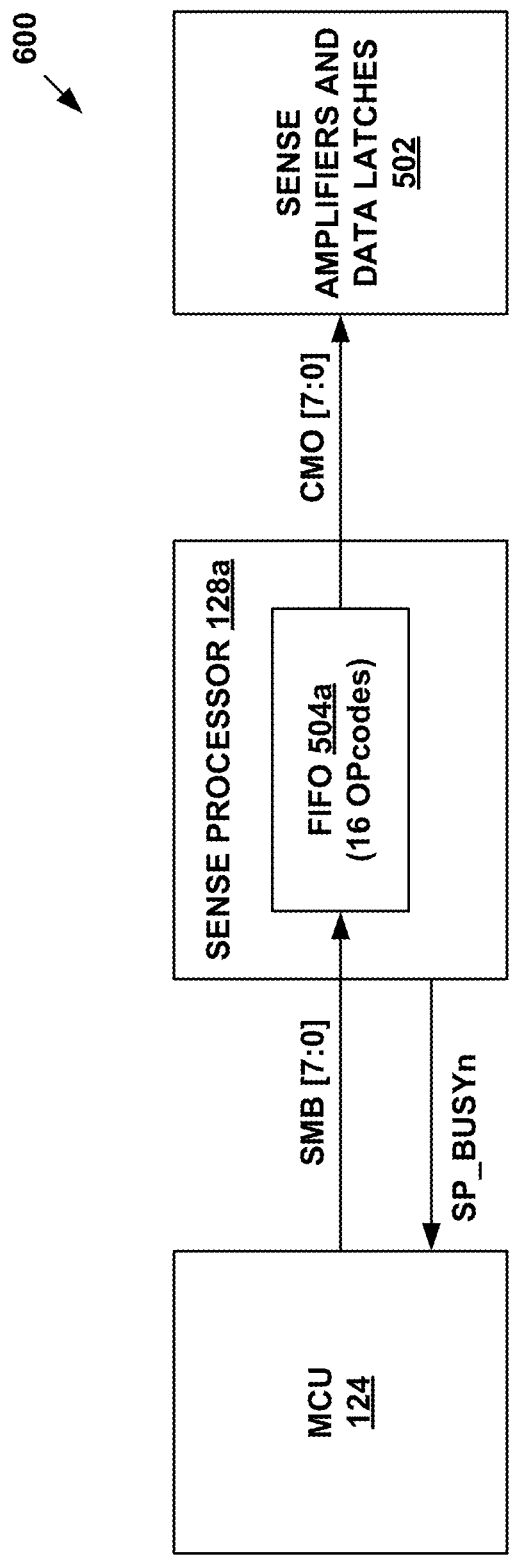
FIG. 6A is a simplified block diagram depicting another example implementation of the microcontroller and sense processor of FIG. 1A for controlling sense amplifiers and data latches of FIG. 5A.

FIG. 6A is a simplified block diagram depicting another example system 600 for controlling sense amplifiers and data latches. System 600 includes MCU 124, sense processor 128a and sense amplifiers and data latches 502. In an embodiment, MCU 124 sends Conditions to sense processor 128a, and sense processor 128a performs SMB operations specified in the Conditions to control sense amplifiers and data latches 502.

In an embodiment, MCU 124 provides at a first output terminal an 8-bit signal SMB[7:0] to an input terminal of FIFO circuit 504a of sense processor 128a. In an embodiment, sense processor 128a provides at an output terminal of FIFO circuit 504a an 8-bit signal CMO[7:0] to an input terminal of sense amplifiers and data latches 502. In an embodiment, sense processor 128a provides at an output terminal signal SP_Busyn to an input terminal of MCU 124.

In the illustrated example, each Condition includes one or more 8-bit OPcodes, and MCU 124 sends commands to sense processor 128a via 8-bit bus SMB[7:0]. The OPcodes that sense processor 128a receives from MCU 124 are stored in FIFO circuit 504a. In an embodiment, each Condition includes a maximum of $O_{MAX}=13$ OPcodes. As described above, in other embodiments $O_{MAX}$ may have more or fewer than 13 OPcodes.

In an embodiment FIFO circuit 504a is configured to have $N_R=(O_{MAX}+N_A)$ registers for storing the OPcodes for any Condition, where $N_A$ is a number of additional registers, and has a value greater than 0. In an embodiment, the number of additional registers $N_A=3$, although other values may be used. Thus, in an embodiment in which $O_{MAX}=13$ OPcodes and the number of additional registers $N_A=3$, FIFO circuit 504a is configured to have $N_R=(13+3)=16$ registers. Persons of ordinary skill in the art will understand that in other embodiments in which $O_{MAX}$ may have more or fewer than 13 OPcodes, and in which the number of additional registers $N_A$ is less than or greater than 3, FIFO circuit 504a may have more or fewer than $N_R=16$ registers.

Figure 6B:
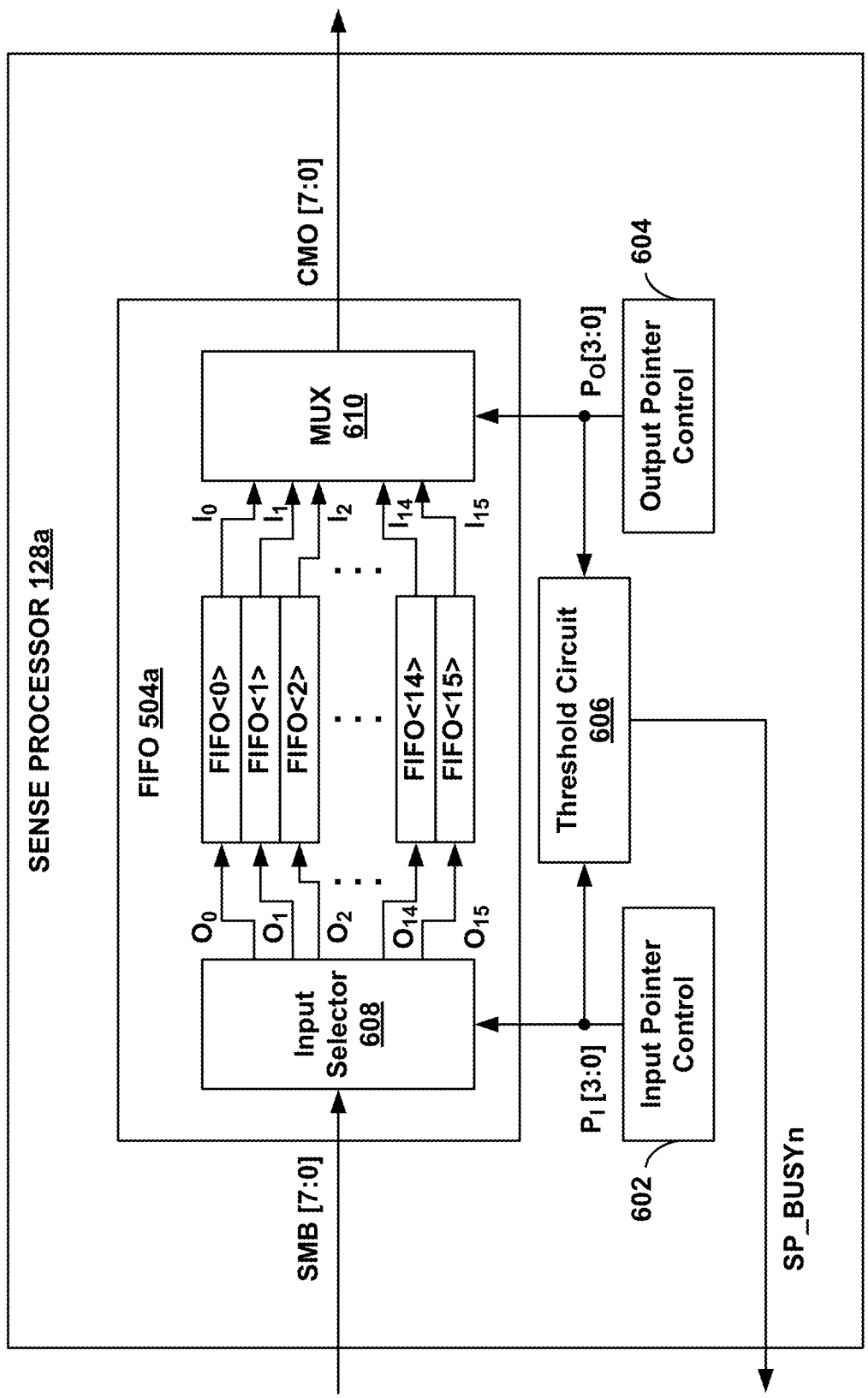
FIG. 6B is a simplified block diagram of an example embodiment of the sense processor of FIG. 6A.

FIG. 6B is a simplified block diagram of an example embodiment of sense processor 128a of FIG. 6A. As described above, sense processor 128a includes FIFO circuit 504a. In an embodiment, sense processor 128a also includes input pointer control circuit 602, output pointer control circuit 604 and threshold circuit 606. In an embodiment, FIFO circuit 504a includes $N_R=16$ registers FIFO<0>, FIFO<1>, FIFO<2>, ..., FIFO<15>, input selector circuit 608 and MUX 610.

In an embodiment, input selector circuit 608 includes a first input terminal coupled to receive 8-bit signal SMB[7:0] from first output terminal of MCU 124, a control terminal coupled to a first output terminal of input pointer control circuit 602, and output terminals $O_1, O_2, \ldots, O_{15}$, each coupled to a corresponding input of one of registers FIFO<0>, FIFO<1>, FIFO<2>, ..., FIFO<15>.

In an embodiment, MUX 610 includes input terminals $I_1, I_2, \ldots, I_{15}$, each coupled to a corresponding output of one of registers FIFO<0>, FIFO<1>, FIFO<2>, ..., FIFO<15>, a control terminal coupled to a first output terminal of output pointer circuit 604, and an output terminal that provides control signals to sense amplifiers and data latches 502 via 8-bit bus CMO[7:0].

In an embodiment, input pointer control circuit 602 includes a first output terminal that provides an input pointer signal $P_I[3:0]$ to the control terminal of input selector circuit 608 and a first input terminal of threshold circuit 606. In an embodiment, input pointer signal $P_I[3:0]$ points to the next available FIFO 504a register FIFO<0>, FIFO<1>, FIFO<2>, ..., FIFO<15> for receiving OPcodes.

In an embodiment, output pointer control circuit 604 includes a first output terminal that provides an output pointer control signal $P_O[3:0]$ to the control terminal of MUX 610 and a second input terminal of threshold circuit 606. In an embodiment, output pointer signal $P_O[3:0]$ points to the FIFO 504a register FIFO<0>, FIFO<1>, FIFO<2> .... FIFO<15> containing an OPcode currently being executed.

In an embodiment, threshold circuit 606 provides at an output terminal a signal SP_BUSYn, which is coupled to an input terminal of MCU 124. In an embodiment, threshold circuit 606 determines a difference value $P_D=(N_R+P_O[3:0]-P_I[3:0])$. In an embodiment, threshold circuit 606 compares difference value $P_D$ with a threshold value T, and causes signal SP_BUSYn to have a first value (e.g., HIGH) if difference value $P_D>T$, and a second value (e.g., LOW) if difference value $P_D \leq T$. In an embodiment, threshold value T is one less than the maximum number of OPcodes $O_{MAX}$. Thus, in an embodiment in which $O_{MAX}=13$, threshold value $T=(13-1)=12$.

Figure 6C:
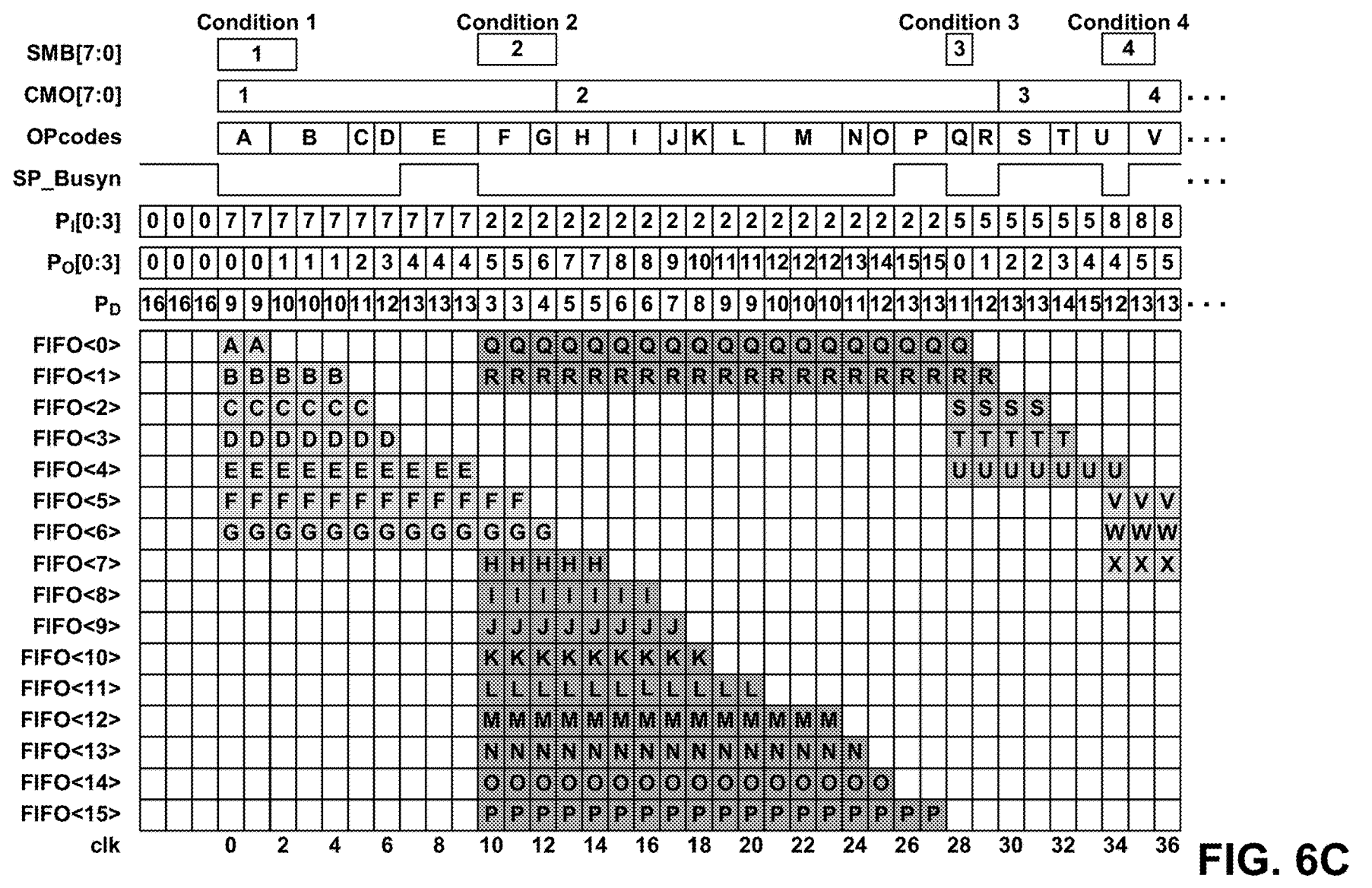

FIG. 6C is a diagram depicting an example operation of system 600 of FIGS. 6A-6B. In particular, FIG. 6C depicts example values of SMB[7:0], CMO[7:0], OPcodes, SP_Busyn, $P_I[3:0]$, $P_O[3:0]$, $P_D$, and the contents of FIFO 504a registers FIFO<0>, FIFO<1> .... FIFO<15> for each of a sequence of clock intervals clk.

Prior to clock interval clk=0, there are no Conditions on 8-bit bus SMB[7:0], FIFO 504a registers FIFO<0>, FIFO<1> ..., FIFO<15> contain no OPcodes, sense processor 128 is not executing any OPcodes and thus there are no timing signals on 8-bit signal CMO[7:0], input pointer signal $P_I[3:0]$ points to the next available FIFO 504a register (FIFO<0>), output pointer signal $P_O[3:0]$ points to the FIFO 504a register currently being executed (FIFO<0>), difference value $P_D=16+ (0-0)=16$, which is greater than threshold value T=12, and thus SP_Busyn is HIGH.

At clock interval clk=0, MCU 124 provides a first Condition (Condition 1) on bus SMB[7:0]. In this example, Condition 1 includes 7 OPcodes: A, B, C, D, E, F, G. In this example, OPcode A requires two clock cycles to execute, OPcode B requires three clock cycles to execute, OPcode C requires one clock cycle to execute, OPcode D requires one clock cycle to execute, OPcode E requires three clock cycles to execute, OPcode F requires two clock cycles to execute, and OPcode G requires one clock cycle to execute. These are example execution durations, and other execution durations may be used.

The seven OPcodes are loaded into seven consecutive registers of FIFO 504a, beginning at the register pointed to by the previous value of input pointer signal $P_I[3:0]$ (i.e., $P_I[3:0]=0$). As each OPcode is loaded into a register, the value of input pointer signal $P_I[3:0]$ is incremented by 1. Thus, in this example, OPcodes A, B, C, D, E, F, G are loaded into FIFO 504a registers FIFO<0>, FIFO<1>, ..., FIFO<6>, and input pointer signal $P_I[3:0]=7$ (pointing to the next available FIFO 504a register (FIFO<7>) for receiving OPcodes. Output pointer signal $P_O[3:0]$ points to the FIFO 504a register currently being executed: (FIFO<0>).

Difference value $P_D=(16+P_O[3:0]-P_I[3:0])=(16+0-7)=9$. Threshold circuit 606 compares difference value $P_D$ with threshold value T=12. Because $P_D=9$ is less than or equal to T=12, threshold circuit 606 causes signal SP_BUSYn to go LOW. In an embodiment, MCU 124 can send Conditions to sense processor 128a only when signal SP_Busyn is HIGH. Thus, beginning at clock interval clk=0, MCU 124 cannot send any additional Conditions to sense processor 128a.

After the OPcodes are loaded into FIFO 504a registers FIFO<0>, FIFO<1>, FIFO<6>, sense processor 128a sequentially executes each OPcode one at a time. Each OPcode remains in its associated register until the OPcode completes execution. As described above, OPcode A requires two clock cycles to execute. Thus, sense processor 128a executes OPcode A for two clock intervals: clk=0 and 1. None of OPcodes B ... G have started execution, so at clock interval clk=1, FIFO 504a registers FIFO<1>, FIFO<2>, FIFO<3>, FIFO<4>, FIFO<5> and FIFO<6> continue to include OPcodes B, C, D, E, F and G, respectively.

At clock interval clk=2 OPcode A has finished being executed, and as a result, OPcode A is removed from FIFO 504a register FIFO<0>. As described above, OPcode B requires three clock cycles to execute. Thus, sense processor 128*a* executes OPcode B for three clock intervals: clk=2, 3 and 4. None of OPcodes C . . . G have started execution, so at clock intervals clk=2, 3 and 4, FIFO 504*a* registers FIFO<2>, FIFO<3>, FIFO<4>, FIFO<5> and FIFO<6> continue to include OPcodes C, D, E, F and G, respectively.

While sense processor 128*a* executes OPcode B during clock intervals clk=2, 3 and 4, output pointer signal $P_O[3:0]$ points to the FIFO 504*a* register currently being executed: (FIFO<1>). Difference value $P_D=(16+P_O[3:0]-P_I[3:0])=(16+1-7)=10$. Threshold circuit 606 compares difference value $P_D$ with threshold value T=12. Because $P_D=10$ is less than or equal to T=12, threshold circuit 606 continues to keep signal SP_BUSYn LOW.

At clock interval clk=5 OPcode B has finished being executed, and as a result, OPcode B is removed from FIFO 504*a* register FIFO<1>. As described above, OPcode C requires one clock cycle to execute. Thus, sense processor 128*a* executes OPcode C for one clock interval: clk=5. None of OPcodes D . . . G have started execution, so at clock interval clk=5, FIFO 504*a* registers FIFO<3>, FIFO<4>, FIFO<5> and FIFO<6> continue to include OPcodes D, E, F and G, respectively.

While sense processor 128*a* executes OPcode C during clock interval clk=5, output pointer signal $P_O[3:0]$ points to the FIFO 504*a* register currently being executed: (FIFO<2>). Difference value $P_D=(16+P_O[3:0]-P_I[3:0])=(16+2-7)=11$. Threshold circuit 606 compares difference value $P_D$ with threshold value T=12. Because $P_D=11$ is less than or equal to T=12, threshold circuit 606 continues to keep signal SP_BUSYn LOW.

At clock interval clk=6 OPcode C has finished being executed, and as a result, OPcode C is removed from FIFO 504*a* register FIFO<2>. As described above, OPcode D requires one clock cycle to execute. Thus, sense processor 128*a* executes OPcode D for one clock interval: clk=6. None of OPcodes E . . . G have started execution, so at clock interval clk=6, FIFO 504*a* registers FIFO<4>, FIFO<5> and FIFO<6> continue to include OPcodes E, F and G, respectively.

While sense processor 128*a* executes OPcode D during clock interval clk=6, output pointer signal $P_O[3:0]$ points to the FIFO 504*a* register currently being executed: (FIFO<3>). Difference value $P_D=(16+P_O[3:0]-P_I[3:0])=(16+3-7)=12$. Threshold circuit 606 compares difference value $P_D$ with threshold value T=12. Because $P_D=12$ is less than or equal to T=12, threshold circuit 606 continues to keep signal SP_BUSYn LOW.

At clock interval clk=7 OPcode D has finished being executed, and as a result, OPcode D is removed from FIFO 504*a* register FIFO<3>. As described above, OPcode E requires three clock cycles to execute. Thus, sense processor 128*a* executes OPcode E for three clock intervals: clk=7, 8, 9. None of OPcodes F, G have started execution, so at clock intervals clk=7, 8, 9, FIFO 504*a* registers FIFO<5> and FIFO<6> continue to include OPcodes F and G, respectively.

While sense processor 128*a* executes OPcode E during clock intervals clk=7, 8, 9, output pointer signal $P_O[3:0]$ points to the FIFO 504*a* register currently being executed: (FIFO<4>). Difference value $P_D=(16+P_O[3:0]-P_I[3:0])=(16+4-7)=13$. Threshold circuit 606 compares difference value $P_D$ with threshold value T=12. Because $P_D=13$ is greater than T=12, threshold circuit 606 causes signal SP_BUSYn to go HIGH.

Thus, beginning at clock interval clk=7, FIFO 504*a* has 13 available registers: FIFO<0>-FIFO<3> and FIFO<7>-FIFO<15>. Because each Condition has a maximum of 13 OPcodes, beginning at clock interval clk=7 threshold circuit 606 causes signal SP_BUSYn to go HIGH and in this regard sense processor 128*a* indicates to MCU 124 that sense processor 128*a* is available to receive another Condition. For clock intervals clk=7, 8, 9, FIFO 504*a* has the same 13 registers available and thus during those clock intervals signal SP_BUSYn remains HIGH, indicating to MCU 124 that sense processor 128*a* is available to receive another Condition.

At clock interval clk=10 OPcode E has finished being executed, and as a result, OPcode E is removed from FIFO 504*a* register FIFO<4>. As described above, OPcode F requires two clock cycles to execute. Thus, sense processor 128*a* executes OPcode F for two clock intervals: clk=10, 11. OPcode G has not started execution, so at clock intervals clk=10, 11 FIFO 504*a* register FIFO<6> continues to include OPcode G.

Also at clock interval clk=10, MCU 124 provides a second Condition (Condition 2) on bus SMB[7:0]. In this example, Condition 2 includes 11 OPcodes: H, I, J, K, L, M, N, O, P, Q, R. In this example, OPcode H requires two clock cycles to execute, OPcode I requires two clock cycles to execute, OPcode J requires one clock cycle to execute, OPcode K requires one clock cycle to execute, OPcode L requires two clock cycles to execute, OPcode M requires three clock cycles to execute, OPcode N requires one clock cycle to execute, OPcode O requires one clock cycle to execute, OPcode {requires two clock cycles to execute, OPcode Q requires one clock cycle to execute, and OPcode R requires one clock cycle to execute. These are example execution durations, and other execution durations may be used.

The eleven OPcodes are loaded into seven consecutive registers of FIFO 504*a*, beginning at the register pointed to by the previous value of input pointer signal $P_I[3:0]$ (i.e., $P_I[3:0]=7$). As each OPcode is loaded into a register, the value of input pointer signal $P_I[3:0]$ is incremented by 1. Thus, in this example, OPcodes H, I, J, K, L, M, N, O, P, Q, R are loaded into FIFO 504*a* registers FIFO<7>, FIFO<8>, FIFO<9>, FIFO<10>, FIFO<11>, FIFO<12>, FIFO<13>, FIFO<14>, FIFO<15>, FIFO<0>, and FIFO<1>, and input pointer signal $P_I[3:0]=2$ (pointing to the next available FIFO 504*a* register (FIFO<2>) for receiving OPcodes. Note that input pointer signal $P_I[3:0]$ is a four bit value, so when input pointer signal $P_I[3:0]$ is incremented past 1111, the count rolls over to start again at 0000. Output pointer signal $P_O[3:0]$ points to the FIFO 504*a* register currently being executed: (FIFO<6>).

While sense processor 128*a* executes OPcode F during clock intervals clk=10, 11, output pointer signal $P_O[3:0]$ points to the FIFO 504*a* register currently being executed: (FIFO<5>). Difference value $P_D=(16+P_O[3:0]-P_I[3:0])=(16+5-2)=3$ (because values roll over to 0 after PD=15). Threshold circuit 606 compares difference value $P_D$ with threshold value T=12. Because $P_D=3$ is less than or equal to T=12, threshold circuit 606 causes signal SP_BUSYn to go LOW.

At clock interval clk=12 OPcode F has finished being executed, and as a result, OPcode F is removed from FIFO 504*a* register FIFO<5>. As described above, OPcode G requires one clock cycle to execute. Thus, sense processor 128*a* executes OPcode G for one clock interval: clk=12. None of OPcodes H, I, J, K, L, M, N, O, P, Q, R have started execution, so at clock interval clk=12, FIFO 504*a* registers FIFO<7>, FIFO<8>, FIFO<9>, FIFO<10>, FIFO<11>, FIFO<12>, FIFO<13>, FIFO<14>, FIFO<15>, FIFO<0>, and FIFO<1> continue to include OPcodes H, I, J, K, L, M, N, O, P, Q, and R, respectively.

While sense processor 128*a* executes OPcode G during clock interval clk=12, output pointer signal $P_O[3:0]$ points to the FIFO 504*a* register currently being executed: (FIFO<6>). Difference value $P_D=(16+P_O[3:0]-P_I[3:0])=(16+6-2)=4$ (because values roll over to 0 after PD=15). Threshold circuit 606 compares difference value $P_D$ with threshold value T=12. Because $P_D=4$ is less than or equal to T=12, threshold circuit 606 continues to keep signal SP_BUSYn LOW. Thus, at the end of clock interval clk=12, sense processor 128*a* has finished executing all OPcodes of Condition 1.

At clock interval clk=13 OPcode G has finished being executed, and as a result, OPcode G is removed from FIFO 504*a* register FIFO<6>. As described above, OPcode H requires two clock cycles to execute. Thus, sense processor 128*a* executes OPcode H for two clock intervals: clk=13 and 14. None of OPcodes I, J, K, L, M, N, O, P, Q, R have started execution, so at clock intervals clk=13 and 14, FIFO 504*a* registers FIFO<8>, FIFO<9>, FIFO<10>, FIFO<11>, FIFO<12>, FIFO<13>, FIFO<14>, FIFO<15>, FIFO<0>, and FIFO<1> continue to include OPcodes I, J, K, L, M, N, O, P, Q, and R, respectively.

Note that after sense processor 128*a* completes executing all OPcodes of Condition 1 at clock interval clk=12, sense processor 128*a* immediately begins executing OPcodes of Condition 2 at clock interval clk=13. Thus, there is no overhead between execution of consecutive Conditions.

While sense processor 128*a* executes OPcode H during clock intervals clk=13 and 14, output pointer signal $P_O[3:0]$ points to the FIFO 504*a* register currently being executed: (FIFO<7>). Difference value $P_D=(16+P_O[3:0]-P_I[3:0])=(16+7-2)=5$ (because values roll over to 0 after PD=15). Threshold circuit 606 compares difference value $P_D$ with threshold value T=12. Because $P_D=5$ is less than or equal to T=12, threshold circuit 606 continues to keep signal SP_BUSYn LOW.

At clock interval clk=15 OPcode H has finished being executed, and as a result, OPcode H is removed from FIFO 504*a* register FIFO<7>. As described above, OPcode I requires two clock cycles to execute. Thus, sense processor 128*a* executes OPcode I for two clock intervals: clk=15 and 16. None of OPcodes J, K, L, M, N, O, P, Q, R have started execution, so at clock intervals clk=15 and 16, FIFO 504*a* registers FIFO<9>, FIFO<10>, FIFO<11>, FIFO<12>, FIFO<13>, FIFO<14>, FIFO<15>, FIFO<0>, and FIFO<1> continue to include OPcodes J, K, L, M, N, O, P, Q, and R, respectively.

While sense processor 128*a* executes OPcode I during clock intervals clk=15 and 16, output pointer signal $P_O[3:0]$ points to the FIFO 504*a* register currently being executed: (FIFO<8>). Difference value $P_D=(16+P_O[3:0]-P_I[3:0])=(16+8-2)=6$ (because values roll over to 0 after PD=15). Threshold circuit 606 compares difference value $P_D$ with threshold value T=12. Because $P_D=6$ is less than or equal to T=12, threshold circuit 606 continues to keep signal SP_BUSYn LOW.

At clock interval clk=17 OPcode I has finished being executed, and as a result, OPcode H is removed from FIFO 504*a* register FIFO<8>. As described above, OPcode J requires one clock cycle to execute. Thus, sense processor 128*a* executes OPcode J for one clock interval: clk=17. None of OPcodes K, L, M, N, O, P, Q, R have started execution, so at clock interval clk=17, FIFO 504*a* registers FIFO<10>, FIFO<11>, FIFO<12>, FIFO<13>, FIFO<14>, FIFO<15>, FIFO<0>, and FIFO<1> continue to include OPcodes K, L, M, N, O, P, Q, and R, respectively.

While sense processor 128*a* executes OPcode J during clock interval clk=17, output pointer signal $P_O[3:0]$ points to the FIFO 504*a* register currently being executed: (FIFO<9>). Difference value $P_D=(16+P_O[3:0]-P_I[3:0])=(16+9-2)=7$ (because values roll over to 0 after PD=15). Threshold circuit 606 compares difference value $P_D$ with threshold value T=12. Because $P_D=7$ is less than or equal to T=12, threshold circuit 606 continues to keep signal SP_BUSYn LOW.

At clock interval clk=18 OPcode J has finished being executed, and as a result, OPcode J is removed from FIFO 504*a* register FIFO<9>. As described above, OPcode K requires one clock cycle to execute. Thus, sense processor 128*a* executes OPcode K for one clock interval: clk=18. None of OPcodes L, M, N, O, P, Q, R have started execution, so at clock interval clk=18, FIFO 504*a* registers FIFO<11>, FIFO<12>, FIFO<13>, FIFO<14>, FIFO<15>, FIFO<0>, and FIFO<1> continue to include OPcodes L, M, N, O, P, Q, and R, respectively.

While sense processor 128*a* executes OPcode K during clock interval clk=18, output pointer signal $P_O[3:0]$ points to the FIFO 504*a* register currently being executed: (FIFO<10>). Difference value $P_D=(16+P_O[3:0]-P_I[3:0])=(16+10-2)=8$ (because values roll over to 0 after PD=15). Threshold circuit 606 compares difference value $P_D$ with threshold value T=12. Because $P_D=8$ is less than or equal to T=12, threshold circuit 606 continues to keep signal SP_BUSYn LOW.

At clock interval clk=19 OPcode K has finished being executed, and as a result, OPcode K is removed from FIFO 504*a* register FIFO<10>. As described above, OPcode L requires two clock cycles to execute. Thus, sense processor 128*a* executes OPcode L for two clock intervals: clk=19 and 20. None of OPcodes M, N, O, P, Q, R have started execution, so at clock intervals clk=19 and 20, FIFO 504*a* registers FIFO<12>, FIFO<13>, FIFO<14>, FIFO<15>, FIFO<0>, and FIFO<1> continue to include OPcodes M, N, O, P, Q, and R, respectively.

While sense processor 128*a* executes OPcode L during clock intervals clk=19 and 20, output pointer signal $P_O[3:0]$ points to the FIFO 504*a* register currently being executed: (FIFO<11>). Difference value $P_D=(16+P_O[3:0]-P_I[3:0])=(16+11-2)=9$ (because values roll over to 0 after PD=15). Threshold circuit 606 compares difference value $P_D$ with threshold value T=12. Because $P_D=9$ is less than or equal to T=12, threshold circuit 606 continues to keep signal SP_BUSYn LOW.

At clock interval clk=21 OPcode L has finished being executed, and as a result, OPcode L is removed from FIFO 504*a* register FIFO<11>. As described above, OPcode M requires three clock cycles to execute. Thus, sense processor 128*a* executes OPcode M for three clock intervals: clk=21, 22 and 23. None of OPcodes N, O, P, Q, R have started execution, so at clock intervals clk=21, 22 and 23, FIFO 504*a* registers FIFO<13>, FIFO<14>, FIFO<15>, FIFO<0>, and FIFO<1> continue to include OPcodes N, O, P, Q, and R, respectively.

While sense processor 128*a* executes OPcode M during clock intervals clk=21, 22 and 23, output pointer signal $P_O[3:0]$ points to the FIFO 504*a* register currently being executed: (FIFO<12>). Difference value $P_D=(16+P_O[3:0]-P_I[3:0])=(16+12-2)=10$ (because values roll over to 0 after PD=15). Threshold circuit 606 compares difference value $P_D$ with threshold value T=12. Because $P_D$=10 is less than or equal to T=12, threshold circuit 606 continues to keep signal SP_BUSYn LOW.

At clock interval clk=24 OPcode M has finished being executed, and as a result, OPcode M is removed from FIFO 504a register FIFO<12>. As described above, OPcode N requires one clock cycle to execute. Thus, sense processor 128a executes OPcode N for one clock interval: clk=24. None of OPcodes O, P, Q, R have started execution, so at clock interval clk=24, FIFO 504a registers FIFO<14>, FIFO<15>, FIFO<0>, and FIFO<1> continue to include OPcodes O, P, Q, and R, respectively.

While sense processor 128a executes OPcode N during clock interval clk=24, output pointer signal $P_O[3:0]$ points to the FIFO 504a register currently being executed: (FIFO<13>). Difference value $P_D=(16+P_O[3:0]-P_I[3:0])=$ (16+13−2)=11 (because values roll over to 0 after PD=15). Threshold circuit 606 compares difference value $P_D$ with threshold value T=12. Because $P_D$=11 is less than or equal to T=12, threshold circuit 606 continues to keep signal SP_BUSYn LOW.

At clock interval clk=25 OPcode N has finished being executed, and as a result, OPcode N is removed from FIFO 504a register FIFO<13>. As described above, OPcode O requires one clock cycle to execute. Thus, sense processor 128a executes OPcode O for one clock interval: clk=25. None of OPcodes P, Q, R have started execution, so at clock interval clk=25, FIFO 504a registers FIFO<15>, FIFO<0>, and FIFO<1> continue to include OPcodes P, Q, and R, respectively.

While sense processor 128a executes OPcode O during clock interval clk=25, output pointer signal $P_O[3:0]$ points to the FIFO 504a register currently being executed: (FIFO<14>). Difference value $P_D=(16+P_O[3:0]-P_I[3:0])=$ (16+14−2)=12 (because values roll over to 0 after PD=15). Threshold circuit 606 compares difference value $P_D$ with threshold value T=12. Because $P_D$=12 is less than or equal to T=12, threshold circuit 606 continues to keep signal SP_BUSYn LOW.

At clock interval clk=26 OPcode O has finished being executed, and as a result, OPcode O is removed from FIFO 504a register FIFO<14>. As described above, OPcode P requires two clock cycles to execute. Thus, sense processor 128a executes OPcode P for two clock intervals: clk=26 and 27. None of OPcodes Q, R have started execution, so at clock intervals clk=26 and 27, FIFO 504a registers FIFO<0> and FIFO<1> continue to include OPcodes Q and R, respectively.

While sense processor 128a executes OPcode P during clock intervals clk=26 and 27, output pointer signal $P_O[3:0]$ points to the FIFO 504a register currently being executed: (FIFO<15>). Difference value $P_D=(16+P_O[3:0]-P_I[3:0])=$ (16+15−2)=13. Threshold circuit 606 compares difference value $P_D$ with threshold value T=12. Because $P_D$=13 is greater than T=12, threshold circuit 606 causes signal SP_BUSYn to go HIGH.

Thus, beginning at clock interval clk=26, FIFO 504a has 13 available registers: FIFO<2>-FIFO<14>. Because each Condition has a maximum of 13 OPcodes, beginning at clock interval clk=26 threshold circuit 606 causes signal SP_BUSYn to go HIGH and in this regard sense processor 128a indicates to MCU 124 that sense processor 128a is available to receive another Condition. For clock intervals clk=26 and 27, FIFO 504a has the same 13 registers available and thus during those clock intervals signal SP_BUSYn remains HIGH, indicating to MCU 124 that sense processor 128a is available to receive another Condition.

At clock interval clk=28 OPcode P has finished being executed, and as a result, OPcode P is removed from FIFO 504a register FIFO<15>. As described above, OPcode Q requires one clock cycle to execute. Thus, sense processor 128a executes OPcode Q for one clock interval: clk=28. OPcode R has not started execution, so at clock interval clk=28 FIFO 504a register FIFO<1> continues to include OPcode R.

Also at clock interval clk=28, MCU 124 provides a third Condition (Condition 3) on bus SMB[7:0]. In this example, Condition 3 includes 3 OPcodes: S. T. U. In this example, OPcode S requires two clock cycles to execute, OPcode T requires one clock cycle to execute, and OPcode U requires two clock cycles to execute. These are example execution durations, and other execution durations may be used.

The three OPcodes are loaded into three consecutive registers of FIFO 504a, beginning at the register pointed to by the previous value of input pointer signal $P_I[3:0]$ (i.e., $P_I[3:0]$=2). As each OPcode is loaded into a register, the value of input pointer signal $P_I[3:0]$ is incremented by 1. Thus, in this example, OPcodes S. T. U are loaded into FIFO 504a registers FIFO<2>, FIFO<3>, and FIFO<4>, and input pointer signal $P_I[3:0]$=5 (pointing to the next available FIFO 504a register (FIFO<5>) for receiving OPcodes. Output pointer signal $P_O[3:0]$ points to the FIFO 504a register currently being executed: (FIFO<0>).

While sense processor 128a executes OPcode Q during clock interval clk=28, output pointer signal $P_O[3:0]$ points to the FIFO 504a register currently being executed: (FIFO<0>). Difference value $P_D=(16+P_O[3:0]-P_I[3:0])=$ (16+0−5)=11. Threshold circuit 606 compares difference value $P_D$ with threshold value T=12. Because $P_D$=11 is less than or equal to T=12, threshold circuit 606 causes signal SP_BUSYn to go LOW.

At clock interval clk=29 OPcode Q has finished being executed, and as a result, OPcode Q is removed from FIFO 504a register FIFO<0>. As described above, OPcode R requires one clock cycle to execute. Thus, sense processor 128a executes OPcode R for one clock interval: clk=29. None of OPcodes S. T. U have started execution, so at clock interval clk=29, FIFO 504a registers FIFO<2>, FIFO<3>, and FIFO<4> continue to include OPcodes S. T, and U, respectively.

While sense processor 128a executes OPcode R during clock interval clk=29, output pointer signal $P_O[3:0]$ points to the FIFO 504a register currently being executed: (FIFO<1>). Difference value $P_D=(16+P_O[3:0]-P_I[3:0])=$ (16+1−5)=12. Threshold circuit 606 compares difference value $P_D$ with threshold value T=12. Because $P_D$=12 is less than or equal to T=12, threshold circuit 606 continues to keep signal SP_BUSYn LOW.

At clock interval clk=30 OPcode R has finished being executed, and as a result, OPcode R is removed from FIFO 504a register FIFO<1>. As described above, OPcode S requires two clock cycles to execute. Thus, sense processor 128a executes OPcode S for two clock intervals: clk=30 and 31. None of OPcodes T, U have started execution, so at clock intervals clk=30 and 31, FIFO 504a registers FIFO<3> and FIFO<4> continue to include OPcodes T and U, respectively.

Note that after sense processor 128a completes executing all OPcodes of Condition 2 at clock interval clk=29, sense processor 128a immediately begins executing OPcodes of Condition 3 at clock interval clk=30. Thus, there is no overhead between execution of consecutive Conditions.

While sense processor 128a executes OPcode S during clock intervals clk=30 and 31, output pointer signal $P_O[3:0]$ points to the FIFO 504a register currently being executed: (FIFO<2>). Difference value $P_D=(16+P_O[3:0]-P_I[3:0])=(16+2-5)=13$. Threshold circuit 606 compares difference value $P_D$ with threshold value T=12. Because $P_D=13$ is greater than T=12, threshold circuit 606 causes signal SP_BUSYn to go HIGH.

Thus, beginning at clock interval clk=30, FIFO 504a has 13 available registers: FIFO<0>, FIFO<1>, and FIFO<5>-FIFO<15>. Because each Condition has a maximum of 13 OPcodes, beginning at clock interval clk=30 threshold circuit 606 causes signal SP_BUSYn to go HIGH and in this regard sense processor 128a indicates to MCU 124 that sense processor 128a is available to receive another Condition. For clock intervals clk=30 and 31, FIFO 504a has the same 13 registers available and thus during those clock intervals signal SP_BUSYn remains HIGH, indicating to MCU 124 that sense processor 128a is available to receive another Condition.

At clock interval clk=32 OPcode S has finished being executed, and as a result, OPcode S is removed from FIFO 504a register FIFO<2>. As described above, OPcode T requires one clock cycle to execute. Thus, sense processor 128a executes OPcode T for one clock interval: clk=32. OPcode U has not started execution, so at clock interval clk=32, FIFO 504a register FIFO<4> continues to include OPcode U.

While sense processor 128a executes OPcode T during clock interval clk=32, output pointer signal $P_O[3:0]$ points to the FIFO 504a register currently being executed: (FIFO<3>). Difference value $P_D=(16+P_O[3:0]-P_I[3:0])=(16+3-5)=14$. Threshold circuit 606 compares difference value $P_D$ with threshold value T=12. Because $P_D=14$ is greater than T=12, threshold circuit 606 continues to keep signal SP_BUSYn HIGH.

At clock interval clk=33 OPcode T has finished being executed, and as a result, OPcode T is removed from FIFO 504a register FIFO<3>. As described above, OPcode U requires two clock cycles to execute. Thus, sense processor 128a executes OPcode U for two clock intervals: clk=33 and 34.

At clock interval clk=34, MCU 124 provides a fourth Condition (Condition 4) on bus SMB[7:0]. In this example, Condition 4 includes 3 OPcodes: V, W, X. In this example, OPcode V requires two clock cycles to execute. This is an example execution duration, and other execution durations may be used.

The three OPcodes are loaded into three consecutive registers of FIFO 504a, beginning at the register pointed to by the previous value of input pointer signal $P_I[3:0]$ (i.e., $P_I[3:0]=5$). As each OPcode is loaded into a register, the value of input pointer signal $P_I[3:0]$ is incremented by 1. Thus, in this example, OPcodes V, W, X are loaded into FIFO 504a registers FIFO<5>, FIFO<6>, and FIFO<7>, and input pointer signal $P_I[3:0]=8$ (pointing to the next available FIFO 504a register (FIFO<8>) for receiving OPcodes. Output pointer signal $P_O[3:0]$ points to the FIFO 504a register currently being executed: (FIFO<4>).

While sense processor 128a executes OPcode U during clock interval clk=34, output pointer signal $P_O[3:0]$ points to the FIFO 504a register currently being executed: (FIFO<4>). Difference value $P_D=(16+P_O[3:0]-P_I[3:0])=(16+4-8)=12$. Threshold circuit 606 compares difference value $P_D$ with threshold value T=12. Because $P_D=12$ is less than or equal to T=12, threshold circuit 606 causes signal SP_BUSYn to go LOW. Thus, at the end of clock interval clk=34, sense processor 128a has finished executing all OPcodes of Condition 2.

At clock interval clk=35 OPcode U has finished being executed, and as a result, OPcode U is removed from FIFO 504a register FIFO<4>. As described above, OPcode U requires two clock cycles to execute. Thus, sense processor 128a executes OPcode U for two clock intervals: clk=35 and 36. None of OPcodes W, X have started execution, so at clock interval clk=35, FIFO 504a registers FIFO<6> and FIFO<7> continue to include OPcodes W and X, respectively.

Note that after sense processor 128a completes executing all OPcodes of Condition 3 at clock interval clk=34, sense processor 128a immediately begins executing OPcodes of Condition 4 at clock interval clk=35. Thus, there is no overhead between execution of consecutive Conditions.

While sense processor 128a executes OPcode V during clock interval clk=35, output pointer signal $P_O[3:0]$ points to the FIFO 504a register currently being executed: (FIFO<5>). Difference value $P_D=(16+P_O[3:0]-P_I[3:0])=(16+5-8)=13$. Threshold circuit 606 compares difference value $P_D$ with threshold value T=12. Because $P_D=13$ is greater than T=12, threshold circuit 606 causes signal SP_BUSYn to go HIGH.

Thus, in the above example, sense processor 128a executes OPcodes of Condition 1 during clock intervals 0-12, executes OPcodes of Condition 2 during clock intervals 13-29, executes OPcodes of Condition 3 during clock intervals 30-34, and begins executing OPcodes of Condition 4 beginning at clock intervals 35. In this regard, sense processor 128a executes consecutive Conditions "back-to-back."

That is, when sense processor completes executing OPcodes of a first Condition at a first clock interval, sense processor 128a commences executing OPcodes of a second Condition at the next successive clock interval. In this regard, sense processor 128a executes Conditions with no overhead or "idle time" between consecutive Conditions. Without wanting to be bound by any particular theory, it is believed that executing OPcodes of successive Conditions back-to-back may reduce programming time of memory cells.

As described above, in an embodiment FIFO circuit 504a is configured to have $N_R=(O_{MAX}+N_A)$ registers for storing the OPcodes for any Condition, where $N_A$ is a number of additional registers, and $O_{MAX}$ is a maximum number of OPcodes in each Condition. In an embodiment, the number of additional registers $N_A$ may be determined as follows: Conditions may be executed back-to-back if the minimum number of clock cycles of the final $N_A$ OPcodes after signal SP_Busyn goes HIGH is greater than the Overhead (FIG. 5B).

In the example in FIG. 5B, the Overhead is about 600 ns. In an embodiment in which each clock cycle has a period of 17.5 ns, the number of additional registers $N_A$ may be determined from the following table:

| $N_A$ | Minimum Number of Clock Cycles (time with 17.5 ns clock period) |
| --- | --- |
| 2 | 32 (560 ns) |
| 3 | 49 (857.5 ns) |
| 4 | 57 (997.5 ns) |

Thus, in this example if the number of additional registers $N_A=3$, the minimum number of clock cycles of the final $N_A=3$ OPcodes after signal SP_Busyn goes HIGH (857.5 ns) is greater than the Overhead (600 ns).

Figure 6D:
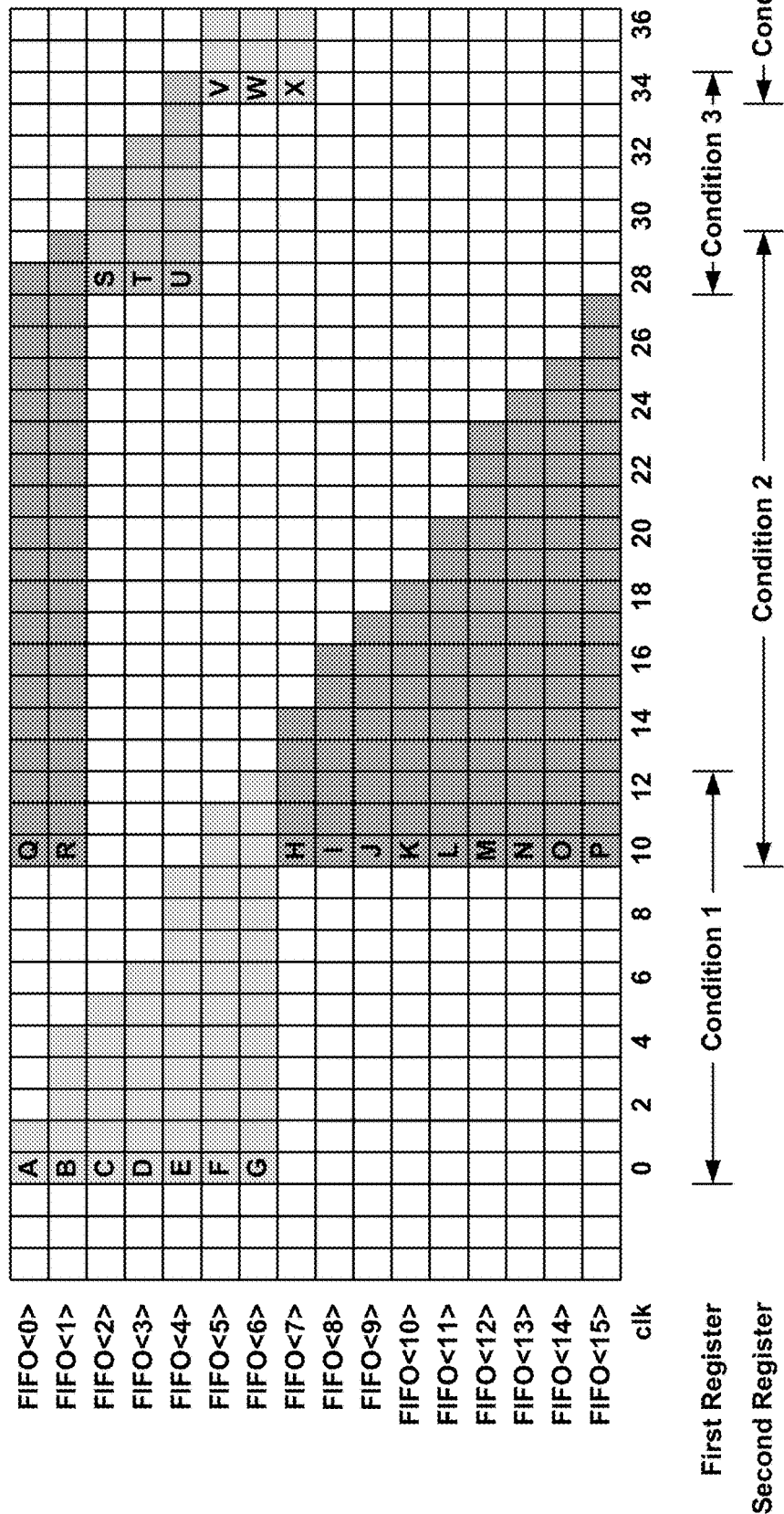
FIG. 6D includes a simplified partial view of the diagram of FIG. 6C, showing the overlap of consecutive Conditions.

As depicted in FIG. 6C, commands in consecutive Conditions can overlap in sense processor 128a. In the example depicted in FIG. 6C, Condition 2 overlaps with Condition 1 during clock intervals clk=10-12, Condition 3 overlaps with Condition 2 during clock intervals clk=28-29, and Condition 4 overlaps with Condition 3 during clock interval clk=34. FIG. 6D includes a simplified partial view of the diagram of FIG. 6C, showing the overlap of consecutive Conditions.

Figure 6E:
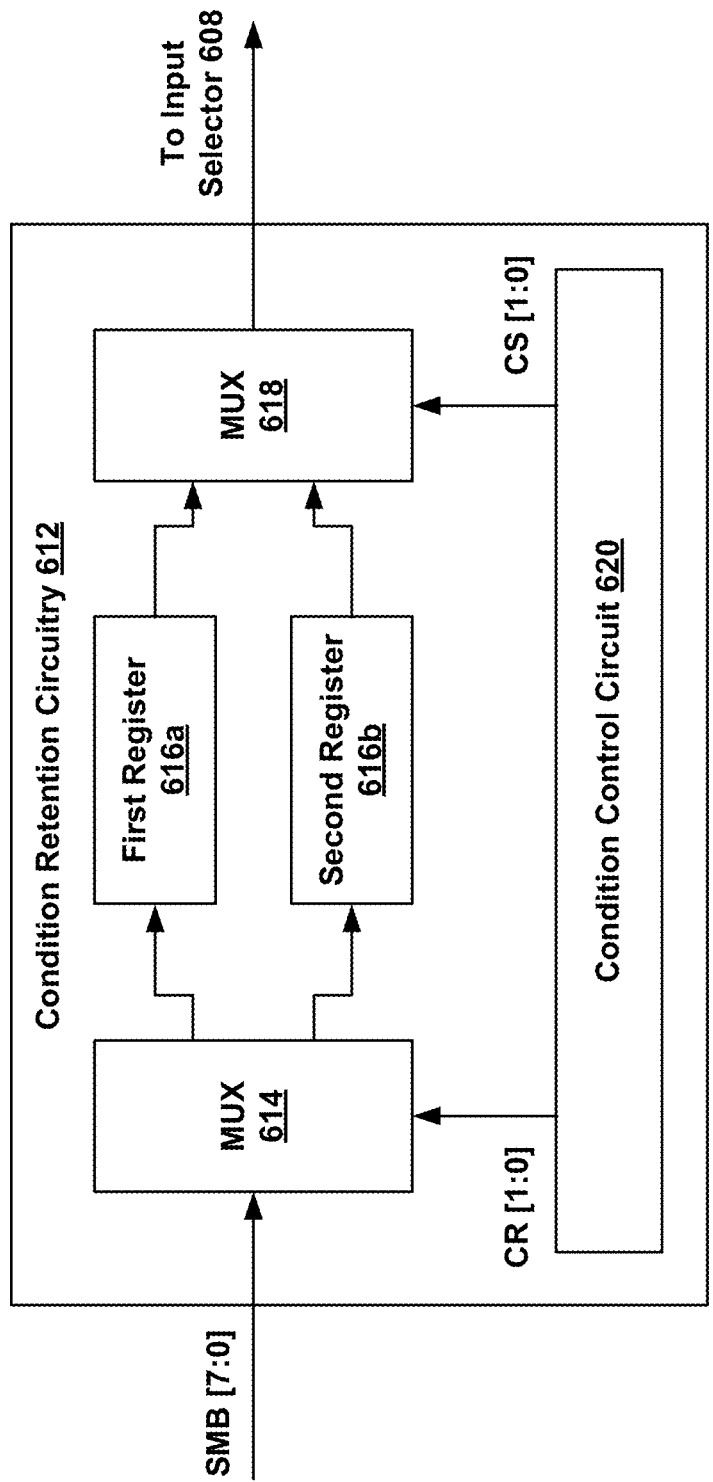
FIG. 6E is a simplified block diagram of condition retention circuitry.

In an embodiment, sense processor 128a includes additional circuitry to retain all commands of each Condition until the condition has completed. FIG. 6E is a simplified block diagram of such condition retention circuitry 612. In an embodiment, condition retention circuitry 612 includes a MUX 614, a first register 616a, a second register 616b, a MUX 618 and a condition control circuit 620. In other embodiment, condition retention circuitry 612 alternatively may include additional. fewer or other circuits.

In an embodiment, MUX 614 includes an input terminal coupled to receive Conditions on SMB bus SMB[7:0], a first output terminal coupled to an input terminal of First Register 616a, and a second output terminal coupled to an input terminal of Second Register 616b. MUX 618 has a first input terminal coupled to an output terminal of First Register 616a, a second input terminal coupled to an output terminal of Second Register 616b, and output terminal coupled to input selector circuit 608 of FIG. 6B.

In an embodiment, condition control circuit 620 provides a first control signal CR[1:0] at a first output terminal coupled to a control input terminal of MUX 614, and provides a second control signal CS[1:0] at a second output terminal coupled to a control input terminal of MUX 618.

In an embodiment, first control signal CR[1:0] causes MUX 614 to alternately couple the signal on SMB bus SMB[7:0] to the input terminal of First Register 616a or Second Register 616b. Thus, as depicted at the bottom of FIG. 6D, Condition 1 is loaded into First Register 616a, then Condition 2 is loaded into Second Register 616b, then Condition 3 is loaded into First Register 616a, then Condition 4 is loaded into Second Register 616b, and so on.

In an embodiment, second control signal CS[1:0] causes MUX 618 to alternately couple the signal on the output terminal of First Register 616a or Second Register 616b to input selector circuit 608 of FIG. 6B. In this regard, condition retention circuitry 612 continually supplies successive Conditions to FIFO circuit 504a while retaining each Condition until the Condition is completed.

Referring again to FIG. 6A, in an embodiment sense processor 128a is configured to operate in either of a first mode, and a second mode. In an embodiment, the first mode is a mode in which consecutive Conditions are not executed back-to-back (e.g., such as in system 500 described above an depicted in FIGS. 5A-5B). The first mode also is referred to herein as "legacy mode." In an embodiment, the second mode is a mode in which consecutive Conditions are executed back-to-back (e.g., such as in system 600 described above an depicted in FIGS. 6A-6E). The second mode also is referred to herein as "back-to-back mode."

In an embodiment, MCU 124 may issue either of two commands to sense processor 128a to instruct sense processor 128a whether successive Conditions should be executed in legacy mode or back-to-back mode. For example, a first command (e.g., LOAD CMD=01h) may specify legacy mode, and a second command (e.g., LOAD CMD=11h) may specify back-to-back mode. In an embodiment, upon receipt of either command, sense processor 128a executes successive Conditions in the corresponding mode. Persons of ordinary skill in the art will understand that other techniques may be used by MCU 124 to instruct sense processor 128a whether successive Conditions should be executed in legacy mode or back-to-back mode.

Figure 7:
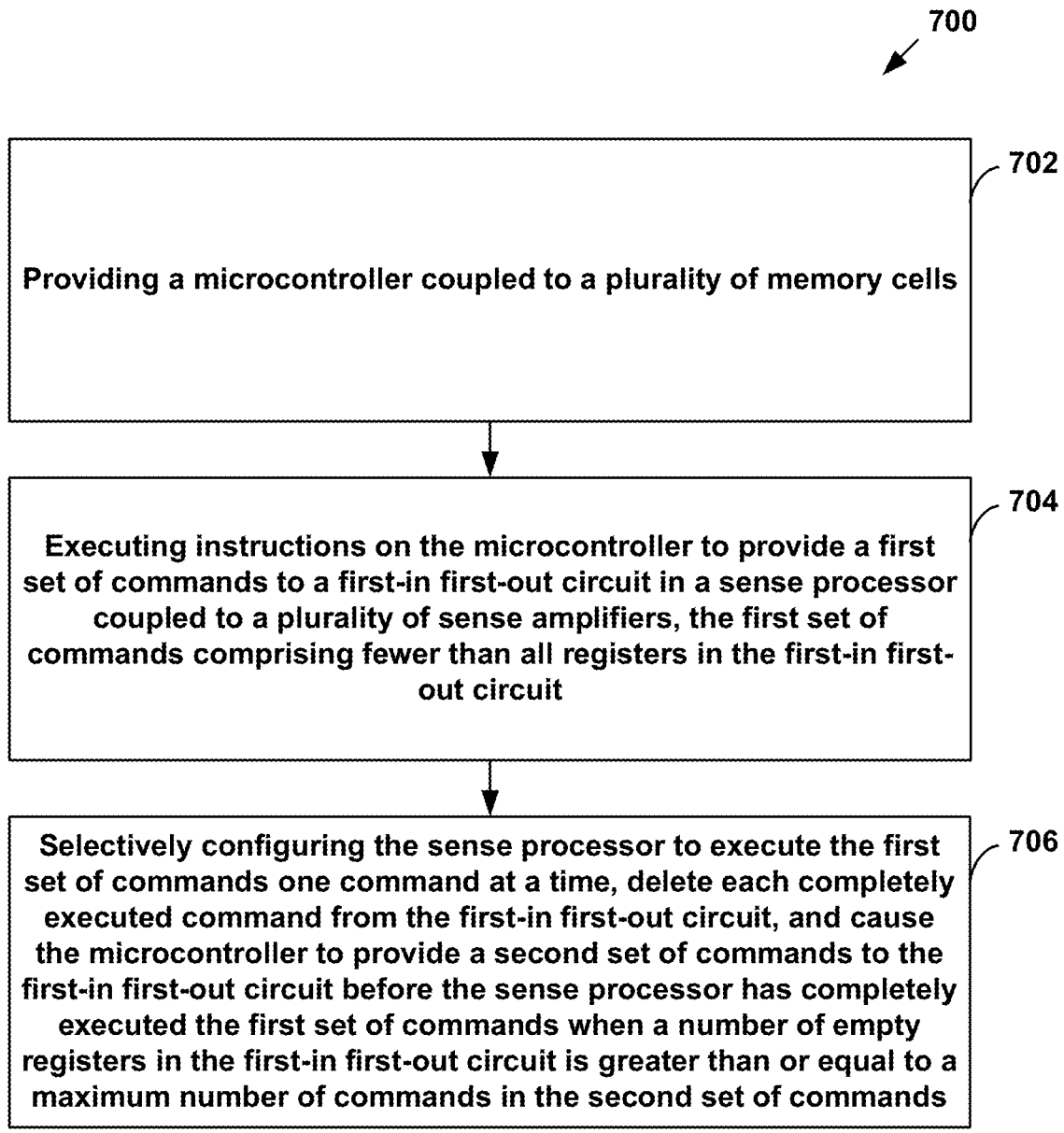
FIG. 7 is a flowchart of an example process for operating the system of FIGS. 6A-6E.

FIG. 7 is a flowchart of an example process 700 for operating system 600 of FIGS. 6A-6E. At step 702, providing a microcontroller coupled to a plurality of memory cells.

At step 704, executing instructions on the microcontroller to provide a first set of commands to a first-in first-out circuit in a sense processor coupled to a plurality of sense amplifiers, the first set of commands comprising fewer than all registers in the first-in first-out circuit.

At step 706, selectively configuring the sense processor to: execute the first set of commands one command at a time, delete each completely executed command from the first-in first-out circuit, and cause the microcontroller to provide a second set of commands to the first-in first-out circuit before the sense processor has completely executed the first set of commands when a number of empty registers in the first-in first-out circuit is greater than or equal to a maximum number of commands in the second set of commands.

In an embodiment, sense processor 128a may include a test mode. In an embodiment, sense processor 128a may be configured to operate in a test mode (e.g., a tester may send a test command to sense processor 128a, and then MCU 124 sends a set of consecutive test Conditions to sense processor 128a to execute the set of consecutive test Conditions. To verify back-to-back operation, the content of one or more internal registers may be checked, and content of data from FIFO circuit 504a and internal signals may be monitored to verify that sense processor 128a executed the set of consecutive test Conditions back-to-back.

Accordingly, it can be seen that, in an embodiment an apparatus is provided that includes a memory structure including non-volatile memory cells, a first processor and a second processor. The first processor is configured to provide a plurality of sets of commands to a second processor to perform memory operations on the non-volatile memory cells. The second processor is configured to execute the sets of commands and provide a control signal to the first processor. The first processor is further configured to provide the sets of commands to the second processor based on a status of the control signal. The second processor is further configured to control the status of the control signal so that the second processor executes sets of commands with no idle time between consecutive sets of commands.

In another embodiment, an apparatus is provided that includes a memory structure including non-volatile memory cells, a plurality of sense amplifiers coupled to the non-volatile memory cells, a first processor configured to receive commands to perform memory operations on the non-volatile memory cells, and a second processor configured to provide control signals to the sense amplifiers based on sets of commands sent from the first processor to the second processor. The first processor and second processor are configured to selectively operate in a first mode of operation and a second mode of operation. In the first mode of operation the first processor sends a first set of commands and waits until the second processor has completed executing the first set of commands before sending a second set of commands. In the second mode of operation the first processor sends the second set of commands before the second processor completes executing the first set of commands.

In another embodiment, a method is provided that includes providing a microcontroller coupled to a plurality of memory cells, executing instructions on the microcontroller to provide a first set of commands to a first-in first-out circuit in a sense processor coupled to a plurality of sense amplifiers, the first set of commands comprising fewer than all registers in the first-in first-out circuit, and selectively configuring the sense processor to execute the first set of commands one command at a time, delete each completely executed command from the first-in first-out circuit, and cause the microcontroller to provide a second set of commands to the first-in first-out circuit before the sense processor has completely executed the first set of commands when a number of empty registers in the first-in first-out circuit is greater than or equal to a maximum number of commands in the second set of commands.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a memory structure comprising non-volatile memory cells; and
a first processor configured to provide a plurality of sets of commands to a second processor to perform memory operations on the non-volatile memory cells, the second processor configured to execute the sets of commands and provide a control signal to the first processor, the first processor further configured to provide the sets of commands to the second processor based on a status of the control signal,
wherein the second processor is further configured to control the status of the control signal so that the second processor executes sets of commands with no idle time between consecutive sets of commands.

2. The apparatus of claim 1, wherein:
each set of commands includes no more than a maximum number of instructions, and
the second processor is configured to store more than the maximum number of instructions.

3. The apparatus of claim 1, wherein:
each set of commands includes a plurality of instructions; and
the second processor is configured to simultaneously store an instruction from a first set of commands and an instruction from a second set of commands in a first-in first-out circuit.

4. The apparatus of claim 1, wherein:
each set of commands includes no more than a first number of instructions; and
the second processor is configured to sequentially store the instructions in a first-in first-out circuit comprising a second number of registers, the second number greater than the first number.

5. The apparatus of claim 1, wherein:
the second circuit comprises a first-in first-out circuit comprising a plurality of registers; and
the second circuit is further configured to set the status of the control signal based on a number of available registers in the first-in first-out circuit.

6. The apparatus of claim 1, wherein the first processor is further configured to provide a first set of commands to the second processor and send a second set of commands to the second processor before the second processor completes executing the first set of commands.

7. The apparatus of claim 1, wherein:
the first processor is further configured to provide a first set of commands to the second processor and subsequently send a second set of commands to the second processor; and
the second processor is further configured begin executing the second set of commands immediately after completing executing the first set of commands.

8. The apparatus of claim 1, further comprising a plurality of sense amplifiers, wherein the second processor is configured to control the sense amplifiers based on the sets of commands from the first processor.

9. The apparatus of claim 1, further comprising a plurality of data latches, wherein the second processor is configured to control the data latches based on the sets of commands from the first processor.

10. The apparatus of claim 1, wherein the apparatus further comprises an integrated circuit comprising a first level on or above a substrate comprising the memory structure, and a second level on or above a substrate comprising the first processor, wherein the first level and second level comprise different levels on or above a substrate.

11. The apparatus of claim 1, wherein the first processor is disposed under the memory structure.

12. An apparatus comprising:
a memory structure comprising non-volatile memory cells;
a plurality of sense amplifiers coupled to the non-volatile memory cells;
a first processor configured to receive commands to perform memory operations on the non-volatile memory cells; and
a second processor configured to provide control signals to the sense amplifiers based on sets of commands sent from the first processor to the second processor, wherein:
the first processor and second processor are configured to selectively operate in a first mode of operation and a second mode of operation;
in the first mode of operation the first processor sends a first set of commands and waits until the second processor has completed executing the first set of commands before sending a second set of commands; and
in the second mode of operation the first processor sends the second set of commands before the second processor completes executing the first set of commands.

13. The apparatus of claim 12, wherein in the first mode of operation the second processor executes sets of commands with idle time between consecutive sets of commands.

14. The apparatus of claim 12, wherein in the second mode of operation the second processor executes sets of commands with no idle time between consecutive sets of commands.

15. The apparatus of claim 12, wherein in the second mode of operation the second processor begins executing the second set of commands immediately after completing executing the first set of commands.

16. The apparatus of claim 12, wherein the memory structure comprises a three dimensional memory array of the non-volatile memory cells.

17. The apparatus of claim 12, wherein the apparatus further comprises an integrated circuit comprising a first level on or above a substrate comprising the memory structure, and a second level on or above a substrate comprising the first processor, wherein the first level and second level comprise different levels on or above a substrate.

18. The apparatus of claim 12, wherein the first processor is disposed under the memory structure.

19. A method comprising:
providing a microcontroller coupled to a plurality of memory cells;
executing instructions on the microcontroller to provide a first set of commands to a first-in first-out circuit in a sense processor coupled to a plurality of sense amplifiers, the first set of commands comprising fewer than all registers in the first-in first-out circuit; and
selectively configuring the sense processor to:
execute the first set of commands one command at a time;
delete each completely executed command from the first-in first-out circuit; and
cause the microcontroller to provide a second set of commands to the first-in first-out circuit before the sense processor has completely executed the first set of commands when a number of empty registers in the first-in first-out circuit is greater than or equal to a maximum number of commands in the second set of commands.

20. The method of claim 19, further comprising selectively configuring the sense processor to:
execute the first set of commands one command at a time;
delete each completely executed command from the first-in first-out circuit;
cause the microcontroller to provide a second set of commands to the first-in first-out circuit only after the sense processor has completely executed the first set of commands.

* * * * *